United States Patent
Xia et al.

(10) Patent No.: US 11,716,023 B2
(45) Date of Patent: Aug. 1, 2023

(54) CLOSED LOOP CONTROL FOR PIEZOELECTRIC-BASED POWER CONVERTERS

(71) Applicant: Texas Instruments Incorporated, Dallas, TX (US)

(72) Inventors: Yinglai Xia, Plano, TX (US); Yogesh Ramadass, San Jose, CA (US); Jessica Danielle Boles, Somerville, MA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 19 days.

(21) Appl. No.: 17/348,122

(22) Filed: Jun. 15, 2021

(65) Prior Publication Data

US 2021/0399638 A1   Dec. 23, 2021

Related U.S. Application Data

(60) Provisional application No. 63/040,660, filed on Jun. 18, 2020.

(51) Int. Cl.
*H02M 3/158* (2006.01)
*H03H 9/17* (2006.01)
*H02M 3/00* (2006.01)

(52) U.S. Cl.
CPC .............. *H02M 3/158* (2013.01); *H03H 9/17* (2013.01); *H02M 3/01* (2021.05)

(58) Field of Classification Search
None
See application file for complete search history.

(56) References Cited

U.S. PATENT DOCUMENTS

| | | | |
|---|---|---|---|
| 5,856,728 A * | 1/1999 | Zimnicki | ........... H05B 41/2827 |
| | | | 315/276 |
| 9,829,903 B1 | 11/2017 | Huang | |

(Continued)

FOREIGN PATENT DOCUMENTS

| | | |
|---|---|---|
| CN | 101938220 A | 1/2011 |
| CN | 102522492 A | 6/2012 |

(Continued)

OTHER PUBLICATIONS

Boles et al., "Analysis of High-Efficiency Operating Modes for Piezoelectric Resonator-Based DC-DC Converters," 2020 IEEE Applied Power Electronics Conference and Exposition (IEEE, 2020), pp. 946-953.

(Continued)

*Primary Examiner* — Matthew V Nguyen
(74) *Attorney, Agent, or Firm* — Frank D. Cimino

(57) ABSTRACT

A power converter including a piezoelectric resonator. The power converter includes a first transistor coupled between an input terminal and a first plate of the piezoelectric resonator, and a second transistor coupled between the first plate of the piezoelectric resonator and an output terminal. A load may be coupled at the output terminal. Controller circuitry has inputs coupled to the input node, the output node, and to the first plate of the piezoelectric resonator, and outputs coupled to control terminals of the first and second transistors. The controller circuitry operates to turn on the first transistor responsive to a comparison of voltages at the first plate and the input terminal, turn on the second transistor responsive to a comparison of voltages at the first plate and the output terminal, and turn off one of the first and second transistors responsive to an output level at the output terminal.

19 Claims, 10 Drawing Sheets

(56) References Cited

U.S. PATENT DOCUMENTS

| | | | |
|---|---|---|---|
| 2017/0012556 A1 | 1/2017 | Jeong et al. | |
| 2018/0367042 A1* | 12/2018 | Andersen | H02M 3/3376 |
| 2020/0098968 A1* | 3/2020 | Despesse | H02M 7/5387 |
| 2021/0194386 A1* | 6/2021 | Despesse | H02M 11/00 |

FOREIGN PATENT DOCUMENTS

| | | | | |
|---|---|---|---|---|
| KR | 20100137913 | * | 12/2010 | H02M 7/06 |
| KR | 2016100563 | * | 8/2016 | H02J 7/0052 |
| WO | 2020/252250 A2 | | 12/2020 | |

OTHER PUBLICATIONS

Boles et al., "High-Efficiency Operating Modes for Isolated Piezoelectric-Transformer-Based DC-DC Converters," 2020 IEEE 21st Workshop on Control and Modeling for Power Electronics (IEEE, 2020), pp. 1-8.

Boles et al., "Enumeration and Analysis of DC-DC Converter Implementations Based on Piezoelectric Resonators," 2019 20th Workshop on Control and Modeling for Power Electronics (IEEE, 2019), pp. 1-8.

Boles et al., "Evaluating Piezoelectric Materials for Power Conversion," 2020 IEEE 21st Workshop on Control and Modeling for Power Electronics (IEEE, 2020), pp. 1-8.

Boles et al., "Enumeration and Analysis of DC-DC Converter Implementations Based on Piezoelectric Resonators," IEEE Trans. on Power Elec., vol. 36, No. 1 (IEEE, 2021), pp. 129-145.

Seo et al., "A magnetic component-less series resonant converter using a piezoelectric transducer for low profile application," The 2010 International Power Electronics Conference (ECCE Asia, 2010), pp. 2810-2814.

Seo et al., "Multilayer piezoelectric transducer design guidelines for low profile magnetic-less DC/DC converter," 8th International Conference on Power Electronics (ECCE Asia 2011), pp. 972-976.

Van Dyke, "The Piezo-Electric Resonator and Its Equivalent Network," Proceedings of the Institute of Radio Engineers, vol. 16, No. 6 (IRE, 1928), pp. 742-764.

Tomalczyk et al., "Piezoelectric Transformer Efficiency Tests in a Digitally Controlled Converter Circuit," 14th Int'l Conf. on Mixed Design (MIXDES, 2007), pp. 592-596.

Diaz et al., "Closing a Second Feedback Loop in a DC-DC Converter Based on a Piezoelectric Transformer," Trans. Power Elec., vol. 22, No. 6 (IEEE, 2007), pp. 2195-2201.

Kyaw et al., "Fundamental Examination of Multiple Potential Passive Component Technologies for Future Power Electronics," Trans. Power Elec., vol. 33, No. 12 (IEEE, 2018), pp. 10708-10722.

Braun et al., "Inductorless Soft Switching DC-DC Converter with an Optimized Piezoelectric Resonator," 2020 IEEE Applied Power Electronics Conference and Exposition (APEC, 2020) pp. 2272-2278.

Touhami et al., "Implementation of Control Strategy for Step-down DC-DC Converter Based on Piezoelectric Resonator," 2020 22nd European Conference on Power Electronics and Applications (ECCE Europe, 2020), pp. 1-9.

Braun et al., "Optimized Resonators for Piezoelectric Power Conversion," Open J. of Power Elec., vol. 2 (IEEE, 2021), pp. 212-224.

Touhami et al., "A New Topology of DC-DC Converter Based On Piezoelectric Resonator," 21st Workshop on Control and Modeling for Power Electronics (Compel) (IEEE, 2020), pp. 1-7.

Pollet et al., "A New Non-Ilsolated Low-Power Inductorless Piezoelectric DC-DC Converter," Trans. on Power Elec., vol. 34, No. 11 (IEEE, 2019), pp. 11002-11013.

Yang et al., "Resonant Current Estimation and Phase-Locked Loop Feedback Design for Piezoelectric Transformer-Based Power Supplies," Trans. on Power Elec., vol. 35, No. 10 (IEEE, 2020), pp. 10466-10476.

Ekhtiari et al., "Optimum Phase Shift in the Self-Oscillating Loop for Piezoelectric-Transformer-Based Power Converters," Trans. on Power Elec., vol. 33, No. 9 (IEEE, 2018), pp. 8101-8109.

Dallago et al., "Modelling of DC-DC converter based on a piezoelectric transformer and its control loop," Proc. of 33rd Annual IEEE Power Elec. Specialists Conf., vol. 2 (IEEE, 2002), pp. 927-931.

Ben-Yaakov et al., "Maximum power tracking of piezoelectric transformer HV converters under load variations," Trans. Power Elec., vol. 21, No. 1 (IEEE, 2006), pp. 73-78.

Yun et al., "Adaptive Phase Control Method for Load Variation of Resonant Converter with Piezoelectric Transformer," 7th International Conference on Power Electronics and Drive Systems (IEEE, 2007), pp. 164-168.

Hamamura et al., "New control method of piezoelectric transformer converter by PWM and PFM for wide range of input voltage," Tech. Proc. of 7th IEEE International Power Electronics Congress (IEEE, 2000) pp. 3-8.

Martin-Ramos et al., "A new full-protected control mode to drive piezoelectric transformers in DC-DC converters," Trans. on Power Elec., vol. 17, No. 6 (IEEE, 2002), pp. 1096-1103.

International Search Report for PCT/US 2021/037448, dated Sep. 2, 2021, 2 pages.

Written Opinion of the International Searching Authority for PCT/US 2021/037448, dated Sep. 2, 2021, 4 pages.

* cited by examiner

CLOSED LOOP CONTROL FOR PIEZOELECTRIC-BASED POWER CONVERTERS

CROSS-REFERENCE TO RELATED APPLICATIONS

This application claims, under 35 U.S.C. § 119(e), the benefit of and priority to U.S. Provisional Application No. 63/040,660 filed Jun. 18, 2020, which is hereby fully incorporated herein by reference.

TECHNICAL FIELD

This relates to electrical power conversion, and is more specifically directed to electrical power conversion using piezoelectric material as an energy storage medium.

BACKGROUND

Switching electrical power converter circuits commonly use passive electrical components, such as inductors, transformers, and capacitors, to store and discharge electrical energy at a given switching frequency. From the standpoint of energy storage density, mechanical energy storage mechanisms exhibit a higher energy storage density than passive electrical components, especially inductors. However, the use of a mechanical energy storage mechanism in an electrical power converter requires transduction of the mechanical energy into electrical energy.

Piezoelectric components, such as piezoelectric resonators and transformers, store energy as mechanical inertia that can be readily transduced to electrical energy and have shown high promise in achievable power density and energy transfer efficiency. Electrically, piezoelectric materials such as lithium niobate and lead zirconium titanate (PZT) offer extremely high energy density at a high quality factor as compared with inductors, and piezoelectric components provide natural mechanisms for galvanic isolation. From a manufacturing standpoint, piezoelectric components exhibit improved scaling properties as compared with magnetic core components, have planar form factors, and can be fabricated compatibly with batch semiconductor manufacturing processes.

SUMMARY

According to one aspect, a power converter circuit (also referred to herein as a converter circuit) including a piezoelectric resonator as an energy storage element is provided. The converter circuit includes a first transistor coupled between an input terminal and a first plate of the piezoelectric resonator, and a second transistor coupled between the first plate of the piezoelectric resonator and an output terminal. A load may be coupled at the circuit output. The power converter includes controller circuitry having inputs coupled to the input terminal, the output terminal, and to the first plate of the piezoelectric resonator, and outputs coupled to control terminals of the first and second transistors. The controller circuitry operates over a plurality of operational cycles to turn on the first transistor responsive to a comparison of voltages at the first plate and the input terminal, turn on the second transistor responsive to a comparison of voltages at the first plate and the output terminal, and to turn off one of the first and second transistors responsive to an output level at the output terminal.

According to another aspect, a method of controlling a power converter circuit including a piezoelectric resonator is provided. The method includes turning on a first transistor coupled between an input terminal and a first plate of the piezoelectric resonator responsive to a comparison of voltages at the first plate of the piezoelectric resonator and the input terminal and turning off that first transistor. The method further includes turning on a second transistor coupled between an output terminal and the first plate of the piezoelectric resonator responsive to a comparison of voltages at the first plate of the piezoelectric resonator and the output terminal and turning off the second transistor. The method also includes repeating the turning on and off of the first and second transistors over a plurality of operational cycles. According to this aspect, the duration of the on state of one of the first or second transistors is responsive to an output level at the output node relative to a reference level.

BRIEF DESCRIPTION OF THE SEVERAL VIEWS OF THE DRAWINGS

The same reference numbers are used in the drawings to illustrate the same or similar (by function and/or structure) features.

DETAILED DESCRIPTION

One or more example implementations are described in this specification in the form of a switching-type electrical power converter circuit applied to direct current (DC) voltages ("DC-DC converters"), as it is contemplated that such implementation is particularly advantageous in that context. However, it is also contemplated that aspects of these implementations may be beneficially applied to other applications. For example, aspects of these implementations may be applied to various power converter topologies, including DC-DC power converters of topologies other than those described, alternating current ("AC-DC converters"), and other electronic circuits in which the energy storage density of piezoelectric material may prove advantageous. Accordingly, it is to be understood that the following description is provided by way of example only and is not intended to limit the true scope of the claims.

Piezoelectric materials and components provide important properties such as high energy storage density at a high quality factor and with natural galvanic isolation. Piezoelectric materials and components can also be reasonably integrated into semiconductor integrated circuits with good scalability, especially as compared with magnetic core components. These properties of piezoelectric materials enable their use in sensing, actuation, transduction, and energy harvesting applications, and render piezoelectric components attractive for use in power converters such as switching DC-DC power converters.

Figure 1A:
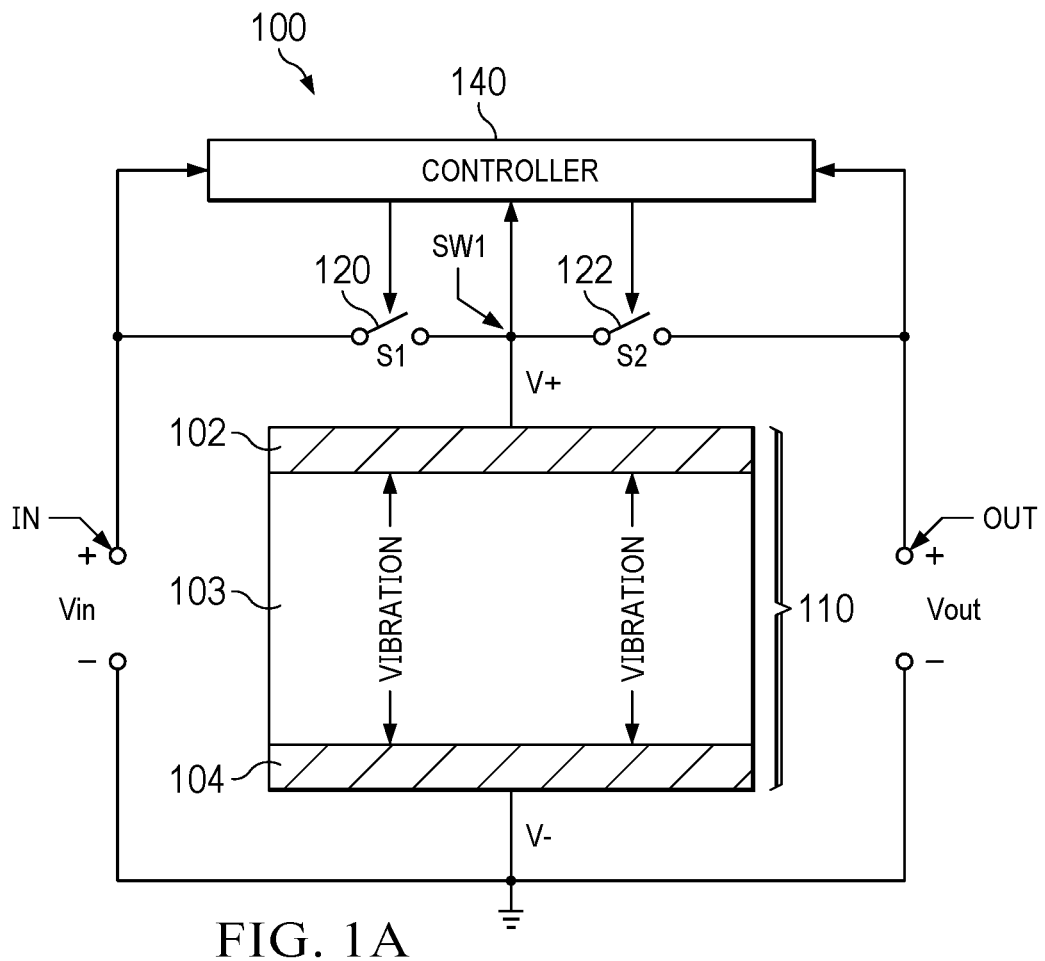
FIG. 1A is an electrical diagram, in schematic form, of a power converter including a parallel-plate piezoelectric resonator as may be implemented according to the described examples.

FIG. 1A illustrates a generalized architecture of a power converter 100.

Power converter 100 includes a parallel-plate piezoelectric resonator 110 constructed with parallel conductive plates 102, 104 on opposite sides of piezoelectric material 103. Piezoelectric material 103 may be of or include lithium niobate, lead zirconium titanate (PZT), or another material suitable for use as described in this specification. In this example, piezoelectric resonator 110 has a length-extensional vibration mode in the same direction as its "poling" direction between its electrical terminals V+, V− (i.e., across parallel plates 102, 104), as indicated in FIG. 1A. Plate 102 of piezoelectric resonator 110 is coupled to or has a piezoelectric resonator terminal SW1, and plate 104 of piezoelectric resonator 110 is coupled to circuit ground.

Figure 1B:
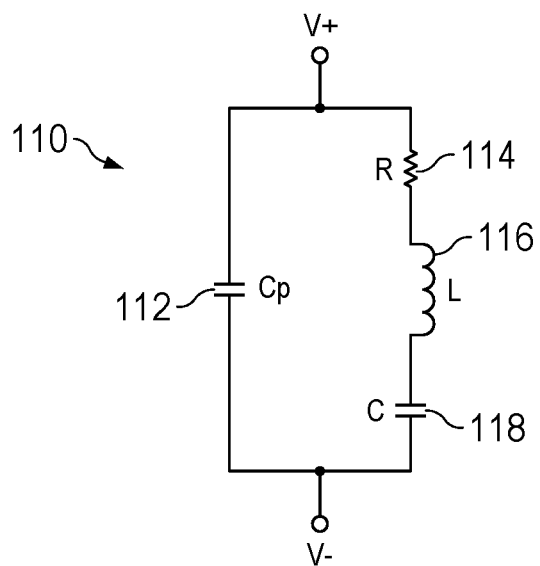
FIG. 1B is an electrical diagram of a circuit model for the parallel-plate piezoelectric resonator in the power converter of FIG. 1A.

In this construction and as applied in a switching power converter operating at MHz frequencies, resonator 110 can be modeled as an LC resonant tank according to the Butterworth-Van Dyke circuit model, for instance as shown in FIG. 1B. This LC resonant tank model considers piezoelectric resonator 110 as a capacitor ($C_p$) 112 in parallel with a series RLC network of resistor 114, inductor 116, and capacitor 118. Parallel capacitor 112 models the capacitance of the parallel-plate construction of the piezoelectric resonator 110 of FIG. 1A, while the series RLC branch models the mechanical vibration property of the piezoelectric material 103 in resonator 110. These properties of piezoelectric resonator 110 can be used in a switching power converter to effect electrical power transfer from input to output, for example in a two-stage operation similar to that of a mass-spring mechanical resonator.

Figure 1C:
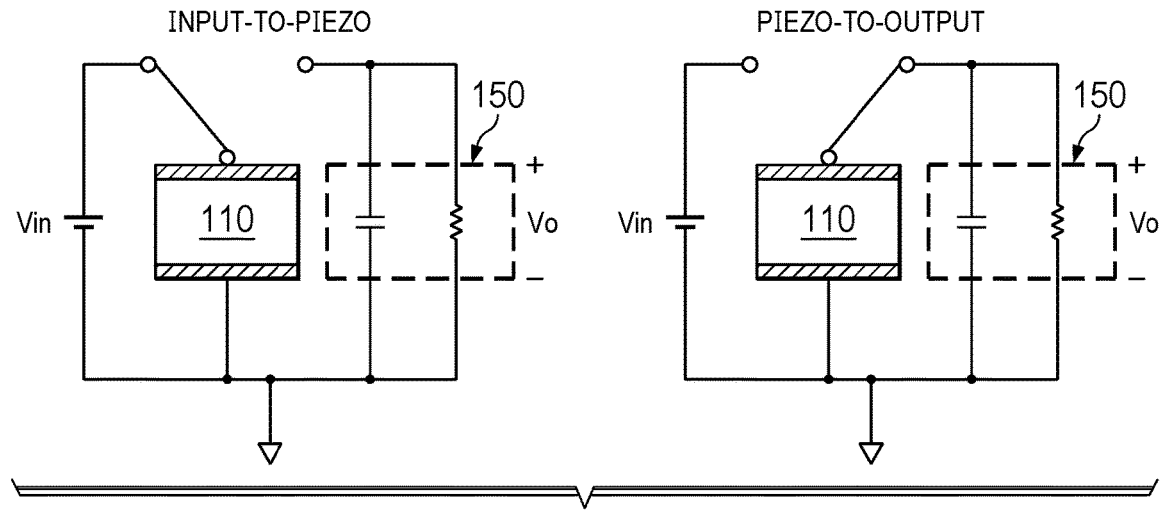
FIG. 1C is an electrical diagram illustrating two stages of operation of a parallel-plate piezoelectric resonator in a power converter.

FIG. 1C illustrates this two-stage power conversion operation. In a first, input-to-piezo, stage as shown in the left-hand side of FIG. 1C, piezoelectric resonator 110 is coupled to a voltage source to receive an input voltage Vin, in order to transfer electrical energy into piezoelectric resonator 110 for storage as mechanical energy (i.e., as vibration of the piezoelectric material 103). This input-to-piezo stage can also be referred as the charging stage. In a second, piezo-to-output, stage as shown in the right-hand side of FIG. 1C, piezoelectric resonator 110 is disconnected from the input voltage Vin and coupled across load 150. In this piezo-to-output stage, the mechanical energy stored by piezoelectric resonator 110 is transferred as electrical energy to load 150, developing an output voltage Vo. This piezo-to-output stage can also be referred to as the discharge stage.

Switching between these two stages at a suitable frequency, for example at about the resonant frequency of piezoelectric resonator 110, provides efficient energy transfer and power conversion from input voltage Vin to output voltage Vo at load 150.

Referring back to FIG. 1A, power converter 100 has an input terminal IN adapted for coupling to an external power source, for example an external DC voltage source providing an input voltage Vin. Power converter 100 also has an output terminal OUT adapted for coupling to a load, at which power converter 100 will provide an output voltage Vout. Output voltage Vout in this implementation is a DC voltage converted from input voltage Vin by the operation of power converter 100. More specifically, power converter 100 includes switch 120 coupled between input terminal IN and terminal SW1 at plate 102 of piezoelectric resonator 110 and switch 122 coupled between terminal SW1 and output terminal OUT. Power converter 100 also includes controller circuitry 140 coupled to input terminal IN, terminal SW1, and output terminal OUT, and coupled to control terminals of switches 120, 122. Switches 120, 122 are constructed to close and open in response to signals S1, S2 applied to their respective control terminals. This closing and opening of switches 120, 122 controls the charging of piezoelectric resonator 110 from input voltage Vin at input terminal IN and the discharging of piezoelectric resonator 110 at output terminal OUT, as output voltage Vout.

It is contemplated that power converter 100 may be realized in various ways. For example, controller circuitry 140, switches 120, 122, and piezoelectric resonator 110 may all be fabricated into the same integrated circuit. Alternatively, controller circuitry 140 and switches 120, 122 may be fabricated into an integrated circuit, with piezoelectric resonator 110 in the form of an external resonator coupled to that integrated circuit, for example in a multi-chip module or as separate components mounted to a circuit board. Other realizations of power converter 100 are contemplated.

As will be described in further detail in connection with certain implementations, controller circuitry 140 generates switching signals S1, S2 in response to voltages received at input terminal IN, terminal SW1, and output terminal OUT. More specifically, controller circuitry 140 controls the timing and duration at which switches 120, 122 are closed in response to the voltages at input terminal IN, terminal SW1, and output terminal OUT so that power converter 100 efficiently produces the intended output voltage Vout at output terminal OUT.

Figure 2:
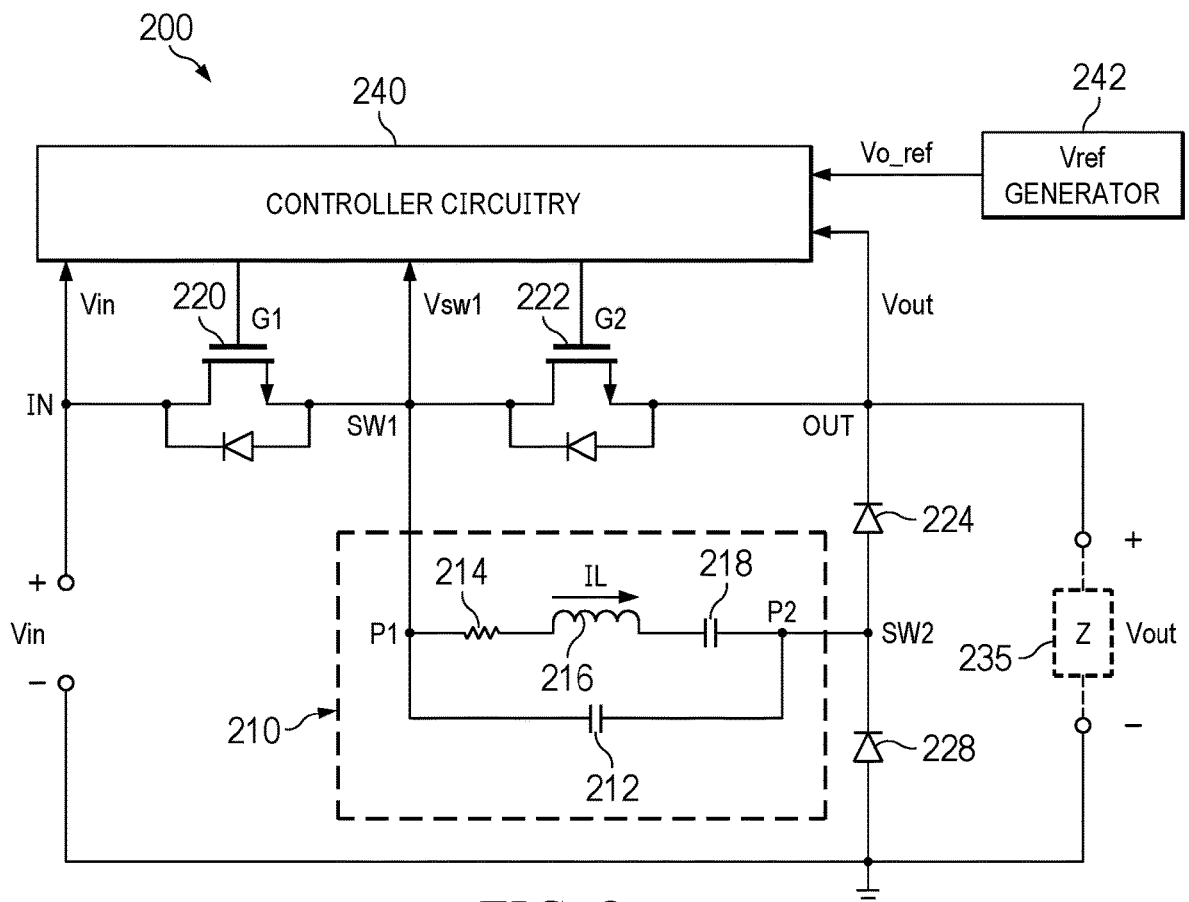
FIG. 2 is an electrical diagram, in block and schematic form, of a power converter according to an example.

FIG. 2 illustrates an example power converter 200 including a piezoelectric resonator 210, according to an implementation of the power converter architecture shown in FIG. 1A. In this example, power converter 200 is based upon piezoelectric resonator 210 operating in a switched two-stage manner as described above relative to FIG. 1C. The particular topology of power converter 200 can vary from that shown in FIG. 2, depending on the intended relationship of output voltage Vout to input voltage Vin. For example, while power converter 200 is constructed as a "buck" DC-DC converter, which provides an output voltage Vout that is lower than the input voltage Vin, it is contemplated that other topologies such as "boost" and "buck-boost" converters may also benefit from these examples. Examples of alternative piezoelectric-based converter topologies and operational sequences in which these examples may be applied are described in Boles et al., "Enumeration and Analysis of DC-DC Converter Implementations Based on Piezoelectric Resonators," 2019 20*th Workshop on Control and Modeling for Power Electronics (COMPEL)*, (IEEE, 2019) pp. 1-8, incorporated herein by this reference. Implementation of power converter 200 according to such other topologies and operational sequences will require the appropriate changes in switching sequences and control from that described herein. As such, the construction and operation of power converter 200 provided in this description is by way of example only.

In this example, piezoelectric resonator 210 constructed in the manner described above relative to FIG. 1A. As such, piezoelectric resonator 210 may be modeled for circuit analysis purposes as described above relative to FIG. 1B, namely as capacitor 212 in parallel with a series RLC branch of resistor 214, inductor 216, and capacitor 218 coupled between terminal SW1 and terminal SW2. From a physical standpoint, one plate P1 of piezoelectric resonator 210 is coupled to terminal SW1, and another plate P2 is coupled to a terminal SW2.

Following the architecture of FIG. 1A, power converter 200 of FIG. 2 has an input terminal IN adapted for coupling to an external power source, for example an external DC voltage source providing an input voltage Vin. Power converter 200 also has an output terminal OUT adapted for coupling to an external load. In the example of FIG. 2, this external load is shown as load 235. Load 235 may exhibit an impedance Z having both resistive and reactive (e.g., capacitive) components. Power converter 200 may operate to produce output voltage Vout at output terminal OUT across load 235.

Power converter 200 in this example includes transistors 220, 222 coupled at terminal SW1 at plate P1 of piezoelectric resonator 210. In this example, each of transistors 220, 222 is an n-channel metal-oxide-semiconductor field-effect transistor (n-channel MOSFET, or NMOS transistor). Alternatively, transistors 220, 222 may be constructed as p-channel (PMOS) transistors. Other transistor types and technologies, such as bipolar transistors, junction FETs, and the like may alternatively be used to realize transistors 220, 222. The drain of transistor 220 is coupled to input terminal IN, and the source of transistor 220 is coupled to terminal SW1. The drain of transistor 222 is coupled to terminal SW1 and the source of transistor 222 is coupled to output terminal OUT. The respective drains and sources of transistors 220, 222 may also be referred to generally as transistor terminals. Power converter 200 further includes diode 224 and diode 228 coupled to terminal SW2 at plate P2 of piezoelectric resonator 210. The anode of diode 224 is coupled to terminal SW2 and the cathode of diode 224 is coupled to output terminal OUT. The cathode of diode 228 is coupled to terminal SW2 and the anode of diode 228 is coupled to circuit ground.

Power controller 200 further includes controller circuitry 240, the construction and operation of which will be described in further detail below. As shown in FIG. 2, controller circuitry 200 has inputs coupled to input terminal IN, output terminal OUT, and terminal SW1 at plate P1 of piezoelectric resonator 210. Controller circuitry 240 has outputs coupled to the gate of transistor 220 and the gate of transistor 222. The respective gates of transistors 220, 222 may also be referred to generally as control terminals. As will be described in further detail below, controller circuitry 240 operates to generate signals G1, G2 to the gates of transistors 220, 222, respectively, in response to input voltage Vin at input terminal IN, voltage Vsw1 at terminal SW1, and output voltage Vout at output terminal OUT. Signals G1, G2 control the conduction state of transistors 220, 222, respectively.

In this example, controller circuitry 240 also has an input coupled to reference voltage generator circuit 242, to receive reference voltage Vo_ref. Reference voltage generator circuit 242 may be realized in the same integrated circuit as power controller 200, or alternatively may be an external function that generates a reference voltage Vo_ref.

Controller circuitry 240, in this example, includes logic and other circuitry configured to generate signals G1 and G2 applied to the gates of transistors 220, 222 to implement two-stage power conversion via piezoelectric resonator 210 according to the operation described above in FIG. 1C. In operation during a first stage (the input-to-piezo or charging stage of FIG. 1C), controller circuitry 240 turns on transistor 220 and turns off transistor 222 to transfer electrical energy from input voltage Vin into piezoelectric resonator 210 for storage as mechanical energy (the input-to-piezo stage of FIG. 1C) by way of a positive current IL through inductor 216. During this first stage, diode 228 will be reverse-biased and diode 224 is forward-biased to provide the return path for the circuit. In a second stage (the piezo-to-output or discharge stage of FIG. 1C), controller circuitry 240 turns off transistor 220 and turns on transistor 222 to transfer stored mechanical energy from piezoelectric resonator 210 (negative current IL through inductor 216) to load 235 as electrical energy. In this second stage, diode 224 is reverse-biased and diode 228 is forward-biased to provide the return path for the circuit. In an example implementation, these two stages are non-overlapping to allow for low-loss resonant charging and discharging ("soft charging") of piezoelectric resonator 210. Controller circuitry 240 also controls the timing and duration of gate signals G1, G2 to attain "zero voltage switching" ("ZVS") (or zero current switching "ZCS") of transistors 220, 222. According to one example of a non-overlapping switching sequence of transistors 220, 222 in the topology of FIG. 2, a voltage Vp across plates P1 and P2 of piezoelectric resonator 210 follows a sequence of: Vin, Vin–Vout, Vout.

In piezoelectric-based power converters, the frequency and timing of the charging and discharge stages of the piezoelectric resonator determine the transfer of energy from the input to the output of the power converter, as well as the efficiency of that energy transfer and other performance parameters. According to an open loop control methodology, one could select the switching frequency to be slightly higher than the resonant frequency of piezoelectric resonator, in an attempt to attain ZVS of the switching devices. One such open loop approach could determine the timing and duration of the transistor switching signals based on mathematical calculation of a set of complex equations applying parameters including the size of the piezoelectric element, etc. Another open loop approach could determine the switching frequency, timing, and duration of the transistor switching signals by trial-and-error, potentially compensating for non-idealities in the piezoelectric element and other components, as well as for temperature and other environmental factors. These approaches can be quite costly and cumbersome, especially considering that characterization of each individual piezoelectric device and consideration of the particular expected electrical and environmental operating conditions may be required.

In contrast, controller circuitry 240 in the implementation of FIG. 2 is constructed and operated to provide closed loop control of the operation of power converter 200. Such closed loop control can attain low-loss resonant charging and discharging ("soft charging") of the piezoelectric element and enable efficient power conversion through ZVS (or zero current switching "ZCS") of transistors 220, 222. By virtue of this closed loop control, this efficient power conversion can be realized over a wide range of electrical and environmental operating conditions, and over variations in piezoelectric element size and characteristics, without requiring individual device characterization, complex calculations, or cumbersome trial-and-error processes and algorithms as may be necessitated by open loop control approaches.

In its general operation, controller circuitry 240 carries out closed loop control to determine the turn-on time of signal G1, the duration of the "on" state of signal G1, the turn-on time of signal G2, and the duration of the "on" state of signal G2, all subject to certain constraints. Example constraints include energy conservation and charge conservation considering the resonant circuit behavior of piezoelectric resonator 210 (as may be calculated by Fourier analysis, for example), and the intended efficiency of energy transfer from input voltage Vin to output voltage Vout. In addition, controller circuitry 240 in this example operates according to a constraint of soft charging so that piezoelectric resonator 210 undergoes only low-loss resonant charging and discharging during operation of power converter 200. To attain such soft charging, controller circuitry 240 in this example is constructed and operated to set the turn-on time of transistor 220 to a time at which the voltage Vsw1, which is the instantaneous voltage at plate P1 of piezoelectric resonator 210, reaches input voltage Vin. Similarly, controller circuitry 240 sets the turn-on time of transistor 222 to a time at which the voltage Vsw1 at plate P1 of piezoelectric resonator 210 has fallen to or below the level of output voltage Vout. The construction of controller circuitry 240 implementing this control of the turn-on times of signals G1 and G2 will be described below.

Figure 9A:
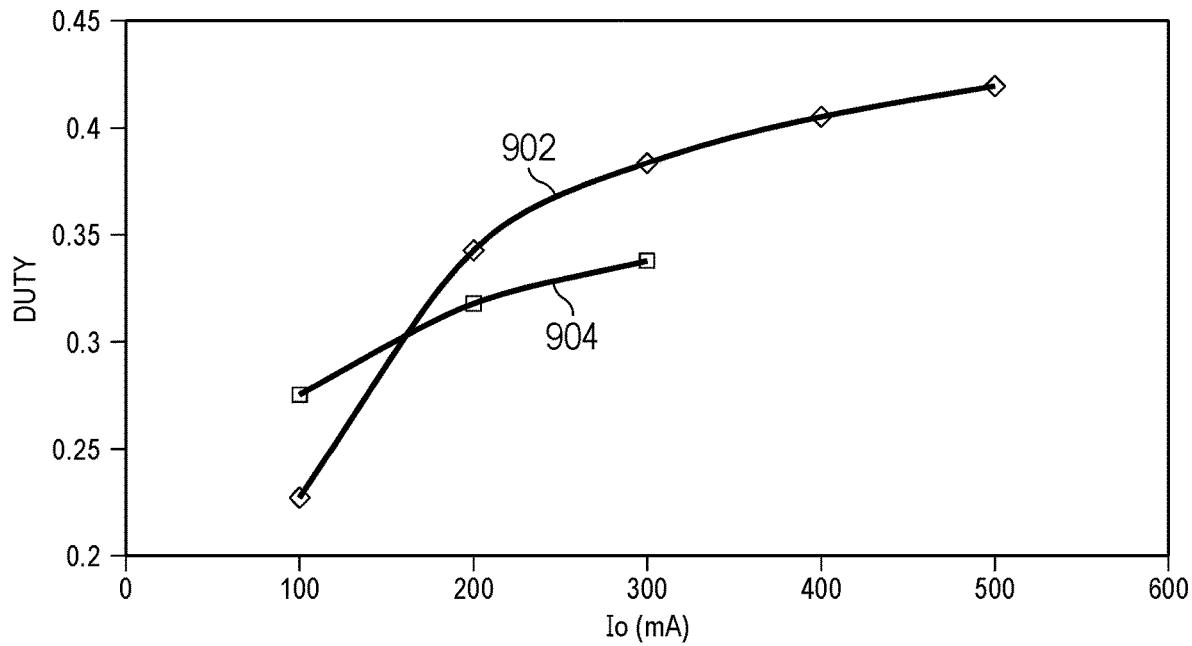
FIG. 9A is a plot of gate signal duty cycle versus output current according to an example.
Figure 9B:
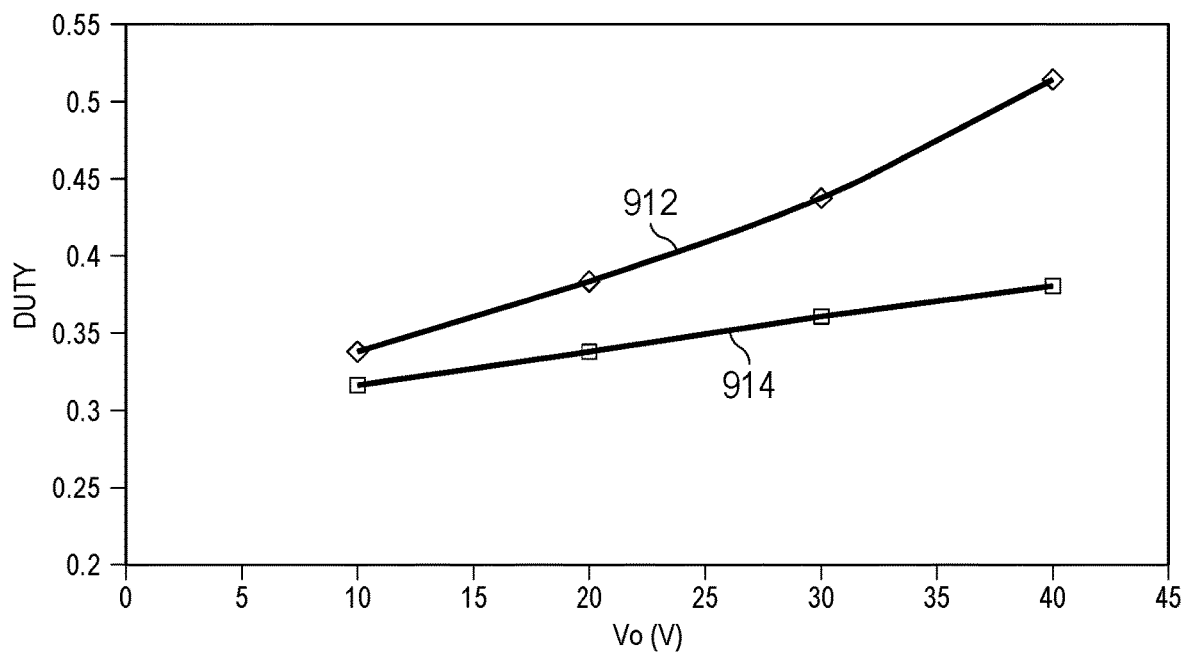
FIG. 9B is a plot of gate signal duty cycle versus output voltage according to an example.

Consideration of the aforementioned constraints in the closed loop control of power converter 200 leaves one degree of freedom in the four control timings, namely the durations of the "on" stages of signals G1 and G2. More specifically, controller circuitry 240 in this example may control the duration of signal G1 for a given duration of signal G2, or instead control the duration of signal G2 for a given duration of signal G1. FIG. 9A illustrates the control of output current Iout applied to load 235 relative to the duration of signals G1 and G2 for an example of power converter 200. Curve 902 of FIG. 9A illustrates the relationship of output current Iout to the duty cycle of gate signal G1 for a given duration of gate signal G2 at an operating condition of input voltage Vin=100V and output voltage Vout=20V, while curve 904 illustrates the relationship of output current Iout to the duty cycle of gate signal G2 for a given duration of signal G1 under those conditions. As evident from a comparison of curves 902, 904, the duty cycle or duration of gate signal G1 for a fixed duration of gate signal G2 provides a wider control range for output current Iout than does the duty cycle of gate signal G2 for a fixed duration of gate signal G1. Referring to FIG. 9B, curve 912 illustrates the relationship of output voltage Vout to the duty cycle of gate signal G1 for a given duration of gate signal G2 at an operating condition of input voltage Vin=100V and output current Iout=300 mA, while curve 914 illustrates the relationship of output voltage Vout to the duty cycle of gate signal G2 for a given duration of gate signal G1 under those conditions. As evident from a comparison of curves 912, 914, the duty cycle or duration of gate signal G1 for a fixed duration of gate signal G2 provides more sensitive control of output voltage Vout than does the duty cycle of gate signal G2 for a fixed duration of gate signal G1.

Based on this analysis of FIG. 9A and FIG. 9B, controller circuitry 240 of power converter 200 in this example is configured to control the transfer of power by controlling the duration of signal G1 for a given duration of signal G2. However, different circuit topologies or system constraints may alternatively favor control of the duration of signal G2 for a given duration of signal G1 in other implementations.

Figure 3:
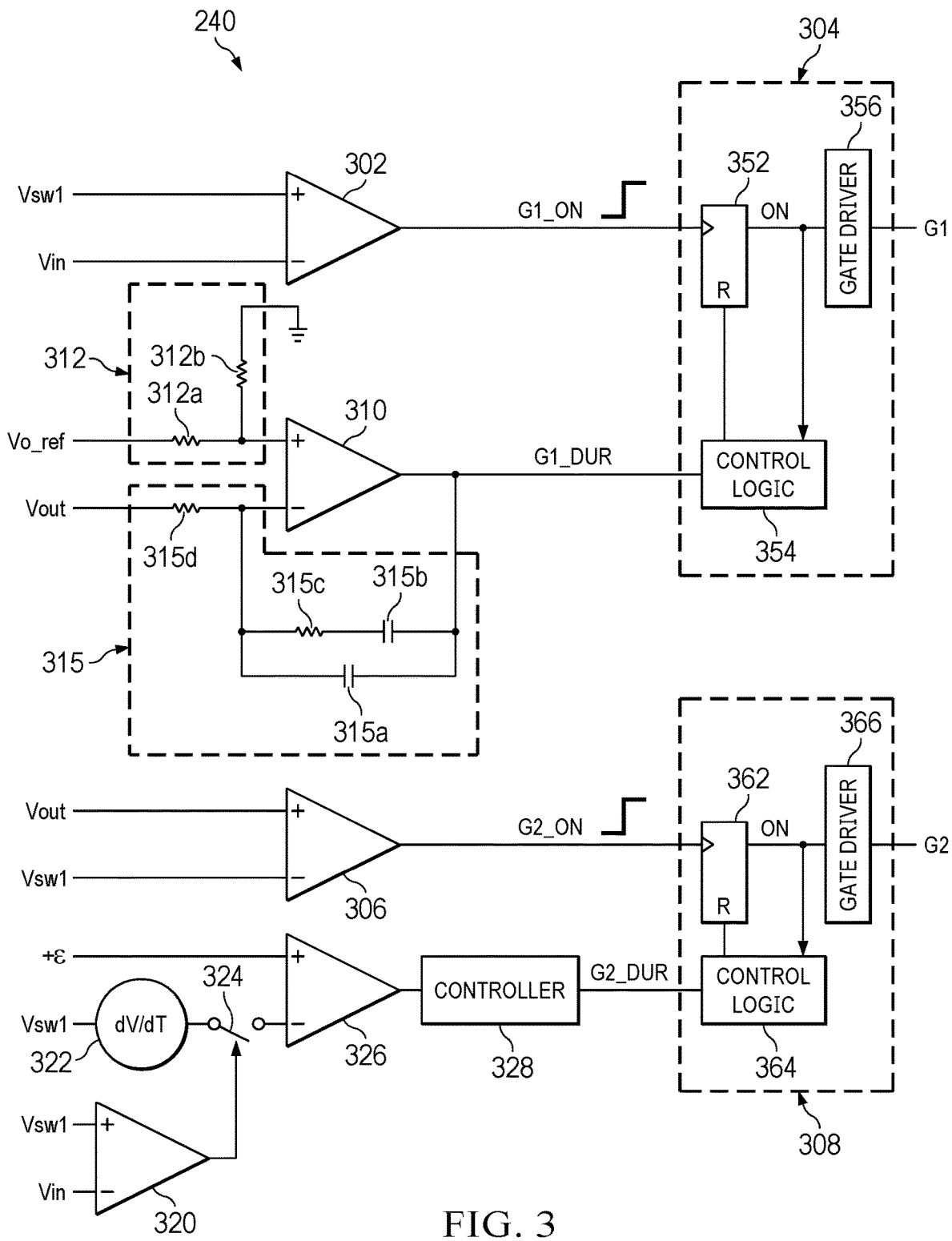
FIG. 3 is an electrical diagram, in block and schematic form, of controller circuitry in the power converter of FIG. 2 according to an example.

FIG. 3 illustrates an example of the construction of controller circuitry 240 of power converter 200 in the example of FIG. 2. Controller circuitry 240 in this example includes a portion constructed to generate signal G1, applied to the gate of transistor 220, at a timing and duration that are under closed-loop control. Controller circuitry 240 further includes a portion constructed to generate signal G2, applied to the gate of transistor 222, at a timing and duration that are under closed-loop control.

In the portion of controller circuitry 240 that generates signal G1 according to this example, comparator 302 receives voltage Vsw1 from plate P1 of piezoelectric resonator 210 at a positive input and receives input voltage Vin at a negative input. The output of comparator 302 is coupled to provide a signal G1_ON to an input of G1 driver circuit 304.

Operational amplifier 310 in controller circuitry 240 receives reference voltage Vo_ref at a non-inverting input and receives output voltage Vout at an inverting input. In this example, reference voltage generator circuit 242 generates reference voltage Vo_ref. This reference voltage Vo_ref is provided to operational amplifier 310 in this example via an input voltage divider 312 including resistor 312a and 312b connected in series between the output of reference generator 342 and ground. An output of operational amplifier 310 is coupled, to provide an analog signal G1_DUR, to G1 driver circuit 304.

Feedback filter 315 is coupled between the output and inverting input of operational amplifier 310. In this example, feedback filter 315 includes capacitor 315a connected in parallel with series-connected capacitor 315b and resistor 315c between the output of operational amplifier 310 and its inverting input. Input resistor 315d is coupled between output terminal OUT and the inverting input of operational amplifier 310. The particular construction and component values of feedback filter 315 are selected to realize appropriate gain and response characteristics for the particular implementation.

G1 driver circuit 304 includes logic and driver circuitry for providing gate signal G1 that is applied to the gate of transistor 220. The construction of G1 driver circuit 304 in this example is shown in block diagram in FIG. 3. In this example, G1 driver circuit 304 includes edge-triggered latch 352 that has an input coupled to the output of comparator 356 to receive signal G1_ON. An output of latch 352 is coupled to an input of gate driver 356, and an output of gate driver 356 is coupled to the gate of transistor 220 (FIG. 2) and presents gate signal G1. Control logic 354 of G1 driver circuit 304 has an input coupled to the output of operational amplifier 310 to receive signal G1_DUR, and also has an input coupled to the output of latch 352. Control logic 354 has an output coupled to a reset input of latch 352.

In the portion of controller circuitry 240 that generates signal G2 according to this example, comparator 306 has a positive input coupled to output terminal OUT to receive output voltage Vout, and a negative input coupled to plate P1 of piezoelectric resonator 210 to receive voltage Vsw1. An output of comparator 306 is coupled to provide signal G2_ON to an input of G2 driver circuit 308.

Comparator 320 has a positive input coupled to plate P1 of piezoelectric resonator 210 to receive voltage Vsw1, and a negative input coupled to input terminal IN to receive input voltage Vin. An output of comparator 320 is coupled to a control terminal of switch 324, such that switch 324 is opened and closed in response to the output of comparator 320.

Differentiator circuit 322 has an input coupled to plate P1 of piezoelectric resonator 210 to receive voltage Vsw1 and an output coupled to switch 324. Differentiator circuit 322 presents an analog signal at its output corresponding to the time rate of change of voltage Vsw1. Switch 324 is coupled between the output of differentiator circuit 322 and a negative input of comparator 326.

Comparator 326 has a positive input coupled a voltage source (not shown) to receive a voltage level representing a small positive value +ε (e.g., a voltage close to but above circuit ground). The output of comparator 326 is coupled to an input of controller 328. In this example, controller 328 is constructed as controller logic or circuitry configured to produce an analog or digital signal G2_DUR in response to a signal received at its input, according to an appropriate transfer function. In one example, controller 328 is constructed to include a proportional-integral (PI) controller. The output of controller 328 is coupled to an input of G2 driver circuit 308, and presents signal G2_DUR.

G2 driver circuit 308 includes logic and driver circuitry for providing gate signal G2 that is applied to the gate of transistor 222. In this example, G2 driver circuit 308 includes edge-triggered latch 362 that has an input coupled to the output of comparator 306 to receive signal G1_ON. An output of latch 362 is coupled to an input of gate driver 366, and an output of gate driver 366 is coupled to the gate of transistor 222 (FIG. 2) and presents gate signal G2. Control logic 364 of G2 driver circuit 308 has an input coupled to the output of controller 328 to receive signal G2_DUR, and also has an input coupled to the output of latch 362. Control logic 364 has an output coupled to a reset input of latch 362.

In operation, the timing at which transistor 220 is turned on is controlled in response to comparator 302 of controller circuitry 240. Comparator 302 compares voltage Vsw1 to voltage Vin. In response to voltage Vsw1 at plate P1 of piezoelectric resonator 210 increasing to a level that reaches input voltage Vin, comparator 302 drives a low-to-high transition of signal G1_ON at its output. This transition of signal G1_ON triggers edge-triggered latch 352 of G1 driver circuit 304, causing latch 352 to drive signal ON to a high logic level in response. Gate driver 356 drives gate signal G1 in response to the state of signal ON at its input from latch 352, and as such, the high logic level of signal ON triggered by the transition of signal G1_ON causes gate driver 356 to then drive gate signal G1 to a level that turns turn on transistor 220 to couple input terminal IN to plate P1 of piezoelectric resonator 210. For the example of FIG. 2, in which transistor 220 is a NMOS transistor, signal G1 is driven to at least a threshold voltage above voltage Vsw1 at the source of transistor 220. The operation of controller circuitry 240 in this example enforces the soft charging constraint by controlling the turn-on time of transistor 220 so that it occurs in response to the instantaneous voltage Vsw1 at plate P1 of piezoelectric resonator 210 charging to a voltage at or close to input voltage Vin.

Controller circuitry 240 controls the length of time that transistor 220 is held on during the input-to-piezo, or charging, stage shown in FIG. 1C, by controlling the duration of signal G1. In operation, operational amplifier 310 drives analog control signal G1_DUR at its output to a voltage corresponding to the level of output voltage Vout relative to a voltage derived by input voltage divider 312 from reference voltage Vo_ref. The response of signal G1_DUR to changes in output voltage Vout is determined by feedback filter 315.

In this example, the passive components 315a, 315b, 315c, and 315d of feedback filter are selected to implement a first or second order controller characteristic with adequate phase margin to attain stability. According to this example, the analog level of control signal G1_DUR at the output of operational amplifier 310 indicates the duration of the time that gate signal G1 turns on transistor 220.

In the example of FIG. 3, control logic 354 is constructed to issue a reset signal to latch 352 at a time following the low-to-high transition of signal ON (received at an input of control logic 354) corresponding to the analog level of control signal G1_DUR from operational amplifier 310. Upon latch 352 being reset by the signal from control logic 354, gate driver 356 drives gate signal G1 to a level that turns off transistor 220, for example at or near the voltage Vsw1 at the source of transistor 220. As such, operational amplifier 310 controls the duration of the "on" state of transistor 220 in a closed loop fashion in response to the energy transferred from input terminal IN to output terminal OUT in each operational cycle of a charging stage and a discharge stage, as described above relative to FIG. 1C, and thus controls the level of output voltage Vout appearing across load 235 at output terminal OUT.

In a qualitative sense, if output voltage Vout across load 235 as generated by power converter 200 is less than the reference level based on reference voltage Vo_ref, controller circuitry 240 controls G1 driver circuit 304 to increase the duration of signal G1 and thus increase the charging time of piezoelectric resonator 210 through transistor 220. Conversely, if output voltage Vout across load 235 is greater than the reference level based on reference voltage Vo_ref, controller circuitry 240 controls G1 driver circuit 304 to shorten the duration of signal G1 and thus shorten the charging time of piezoelectric resonator 210.

In this example, controller circuitry 240 controls energy transfer by its comparison of output voltage Vout across load 235 to reference voltage Vo_ref. Alternatively, controller circuitry 240 may be constructed to compare an output current to load 235 with a reference current to control the energy transferred by power converter 200. In any case, the duration of signal G1 and thus the time that transistor 220 is turned on in each cycle controls the level of output voltage Vout in this example.

Comparator 306 of controller circuitry 240 controls the timing at which transistor 222 is turned on in response to a comparison of voltage Vsw1 and output voltage Vout. In response to voltage Vsw1 at plate P1 falling to the level of output voltage Vout, comparator 306 generates a low-to-high transition of signal G2_ON. In this example, latch 362 drives signal ON at its output to a high logic level in response to receiving a low-to-high transition at its input from comparator 306. The high level of signal ON causes gate driver 366 to drive gate signal G2 to a level that turns on transistor 222. For the example of FIG. 2, in which transistor 222 is an NMOS transistor, gate driver 366 drives signal G2 to at least a threshold voltage above output voltage Vout at the source of transistor 222. In this manner, the operation of controller circuitry 240 in this example enforces the soft charging constraint on the turn-on time of transistor 222 in response to the instantaneous voltage Vsw1 at plate P1 of piezoelectric resonator 210 discharging to a voltage at or below output voltage Vout.

Controller circuitry 240 also controls the length of time that transistor 222 is held on during the piezo-to-output, or discharge, stage shown in FIG. 1C by controlling duration of gate signal G2. In this example, in response to the voltage Vsw1 at plate P1 of piezoelectric resonator 210 reaching input voltage Vin, comparator 320 applies a high level control signal to switch 324, causing switch 324 to close. As described above, gate signal G1 is also asserted by comparator 302 to turn on transistor 220 in response to voltage Vsw1 reaching input voltage Vin.

The closing of switch 324 samples the output of differentiator circuit 322, which presents an analog level corresponding to the time rate of change of voltage Vsw1, and applies that sampled output to the negative input of comparator 326 for comparison with the small positive value +ε at its positive input. By this comparison, comparator 326 operates to determine whether voltage Vsw1 is rapidly increasing at the time it reaches input voltage Vin (indicated by a relatively high level at the output of differentiator circuit 322), or is at or near the peak of its charging curve as it reaches input voltage Vin (indicated by a relatively low level at the output of differentiator circuit 322). Comparator 326 issues a logic level at its output to controller 328 in response to this comparison of the time rate of change of voltage Vsw1 at the time it reaches input voltage Vin.

Controller 328 in this example is configured to generate an analog level on signal G2_DUR in response to the output of comparator 326, which corresponds to the sampled time rate of change of voltage Vsw1 at the time it reaches input voltage Vin, as described above. In response to the level of analog signal G2_DUR, G2 drive circuit 308 controls the time at which it drives gate signal G2 to a low level (e.g., at or near ground) to turn off transistor 222 and thus controls the duration of the interval following the energizing (or low-to-high transition) of gate signal G2.

As shown in the example of FIG. 3, signal G2_DUR is received by control logic 364, which is constructed to issue a reset signal to latch 362 at a time following the low-to-high transition of signal ON (received at an input of control logic 364) corresponding to the analog level of control signal G2_DUR from controller 328. According to this example, controller 328 is constructed and operates to control the level of signal G2_DUR, and thus the duration of the on state of transistor 222, so that the voltage Vsw1 is close to its peak voltage as it reaches input voltage Vin. For example, controller 328 may be constructed as a proportional-integral (PI) controller applying a transfer function that regulates the duration of gate drive signal G2, and thus the transfer of energy from piezoelectric resonator 210 to load 235 at output terminal OUT, so that the time rate of change of voltage Vsw1 when it equals input voltage Vin is close to zero (e.g., at a value corresponding to +ε at the positive input of comparator 326).

This small positive value +ε serves as the reference to comparator 326 because the time rate of change of voltage Vsw1 is sampled when voltage Vsw1 has increased to the level of input voltage Vin, thereby preventing voltage Vsw1 from decreasing at the sampling time in this example. For proper regulation by controller 328, the output of comparator 326 presents both positive and negative levels to controller 328, and therefore the reference value at comparator 326 cannot be zero in this example. For the example of controller 328 realized as a PI controller, the transfer function applied by controller 328, expressed in the Laplace domain, may be in the form of:

$$\frac{K_P s + K_I}{s}$$

where s is the Laplace frequency, and where proportional coefficient $K_P$ and integral coefficient $K_I$ are selected through characterization or adaptation to provide the desired control of the duration of gate signal G2 for the particular implementation of power converter 200, with a phase margin of at least 45° to ensure stability.

In this manner, controller circuitry 240 according to this example controls the duration of the "on" state of transistor 222 so that transistor 222 is turned off at a point in time that the time rate of change of voltage Vsw1 at plate P1 of piezoelectric resonator 210 is at or near zero when voltage Vsw1 is at input voltage Vin. This control of the duration of gate signal G2 thus enforces ZVS of transistor 220.

In a qualitative sense, a large value of the time rate of change of voltage Vsw1, sampled when voltage Vsw1 reaches input voltage Vin, indicates that not enough energy is being transferred to output terminal OUT in the discharge stage of the charge-discharge cycle. In response to this large value of the sampled time rate of change, controller 328 tends to increase the level of signal G2_DUR applied to G2 gate driver 308 to increase the duration of gate signal G2. On the other hand, a sampled value of the time rate of change of voltage Vsw1 that is close to zero (e.g., below value +ε) may indicate that more energy could be transferred to output terminal OUT in the discharge stage. In response to the sampled time rate of change having a value close to zero, controller 328 tends to decrease the level of signal G2_DUR to cause G2 gate driver 308 to decrease the duration of gate signal G2.

According to this example, therefore, controller circuitry 240 controls the duration of gate signal G2 so that transistor 222 is turned on under ZVS conditions, namely a small to zero time rate of change of voltage Vsw1 at the time it reaches input voltage Vin. With this controlled duration of gate signal G2, the duration or duty cycle of gate signal G1 is thus used to control the output voltage Vout (or output current Iout) of power converter 200. As described above for the example of power converter 200 of FIG. 2, output voltage Vout is controlled through the action of operational amplifier 310 comparing output voltage Vout with a voltage derived from reference voltage Vo_ref.

Figure 4:
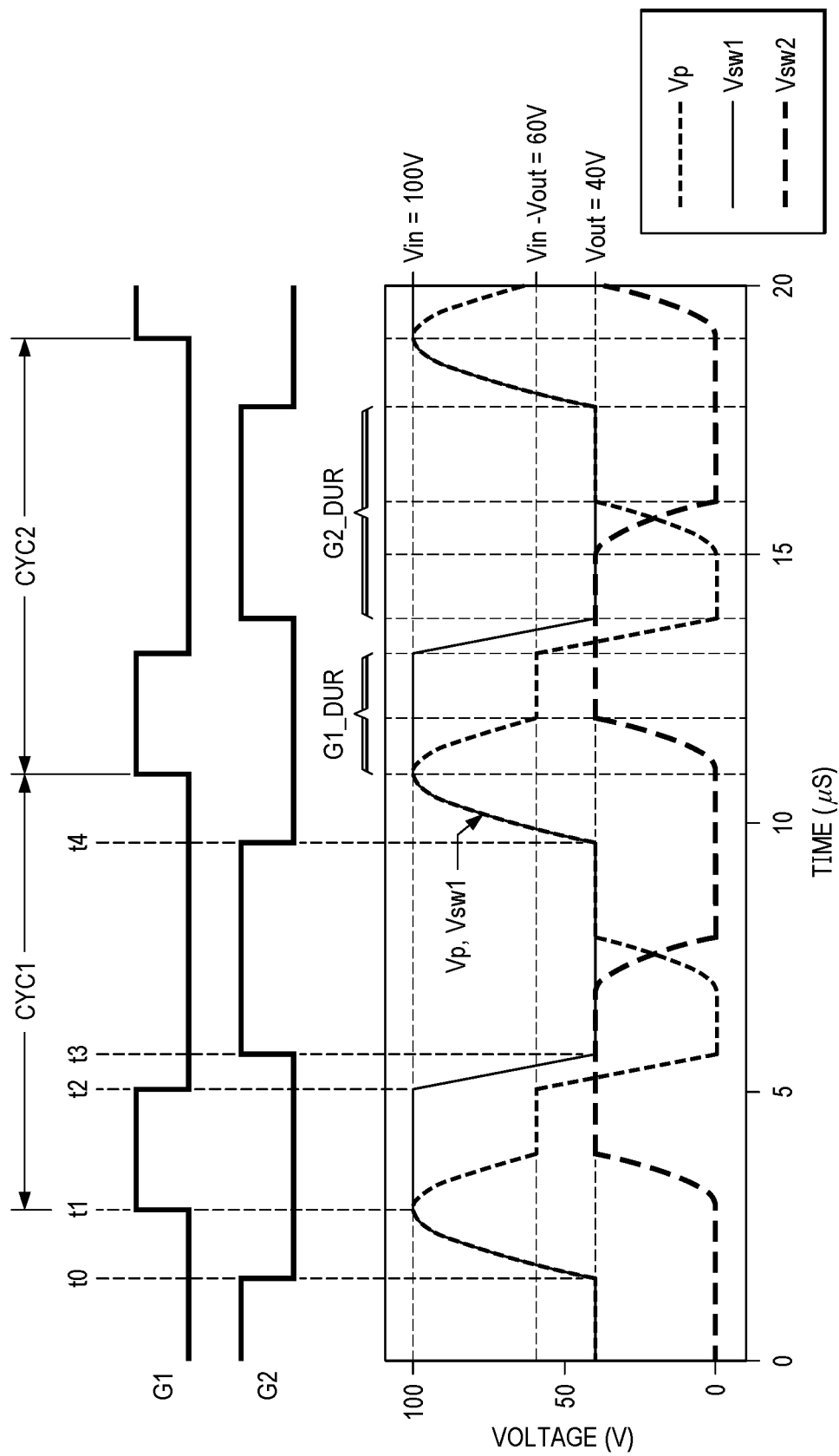
FIG. 4 is a timing diagram illustrating the operation of the power converter of FIG. 2 under control of the controller circuitry of FIG. 3 according to an example.

FIG. 4 illustrates an example of the operation of power converter 200 over two operational cycles CYC1, CYC2. In this example of FIG. 4, input voltage Vin is 100 V, and output voltage Vout is to be regulated by power converter 200 to a level of 40 V. Voltages Vsw1 and Vsw2 at piezoelectric resonator terminals SW1, SW2, respectively, are shown in FIG. 4, as is a voltage Vp=Vsw1−Vsw2 corresponding to the voltage across plates P1 and P2 of piezoelectric resonator 210. The timing and duration of gate signals G1 and G2 generated by G1 driver circuit 304 and G2 driver circuit 308, respectively, are shown with reference to the other voltages in FIG. 4.

Prior to time t1, both of gate signals G1 and G2 are at a low level so that both transistors 220, 222 are both off. Beginning from time t0, in the cycle previous to cycle CYC1, capacitor 212 in piezoelectric resonator 210 (FIG. 2) is being charged by negative inductor current IL from the resonant mechanical vibration of the piezoelectric material. As such, voltage Vsw1 (and voltage Vp, because voltage Vsw2 is near ground) increases from the level of output voltage Vout until it reaches the level of input voltage Vin at time t1 at the beginning of cycle CYC1. In response, comparator 302 transitions its output signal G1_ON from low to high, and in response to that transition, G1 driver circuit 304 drives gate signal G1 to a high level to turn on transistor 220. Because voltage Vsw1 is at the level of input voltage Vin with a relatively small time rate of change at time t1, the charging of piezoelectric resonator 210 from input terminal IN beginning at time t1 is a soft charging, and the turning on of transistor 220 is at ZVS.

Controller circuitry 240 holds transistor 222 off (open) by providing gate signal G2 at a low level. Transistor 220 remains in its on (closed) state in the interval between time t1 and time t2, transferring power from input terminal IN to piezoelectric resonator 210 following time t1. This interval between time t1 and time t2 corresponds to the charging stage of piezoelectric resonator 210 described above relative to FIG. 1C. This charging raises voltage Vsw2 of plate P2 and reduces the voltage Vp until voltage Vp reaches a voltage at the difference between input voltage Vin and output voltage Vout (at about 60 V in this example). At time t2, the duration indicated by analog signal G1_DUR at the output of operational amplifier 310 elapses. At this time t2, G1 driver circuit 304 drives gate signal G1 to a low level (e.g., at or near ground) to turn off transistor 220 and the charging stage of piezoelectric resonator 210 ends.

Between time t2 and time t3, during which both of transistors 220, 222 are in an open (off) state, voltage Vsw1 at plate P1 of piezoelectric resonator 210 falls toward output voltage Vout as piezoelectric resonator 210 discharges to output terminal OUT through diode 224. In response to voltage Vsw1 falling to the level of output voltage Vout, comparator 306 drives a low-to-high transition at output signal G2_ON. In response to the transition of signal G2_ON, G2 driver circuit 308 drives gate signal G2 to a high level to turn on transistor 222, which occurs at time t3 in FIG. 4. Transistor 222 in its on state couples terminal SW1 to output terminal OUT. Because voltage Vsw1 is at output voltage Vout at time t3, transistor 222 turns on at ZVS. Inductor current IL changes polarity, soft charging capacitor 212, and power transfers from piezoelectric resonator 210 to output terminal OUT through transistor 222 in its on state. This interval between time t3 and time t4 corresponds to the discharge stage of piezoelectric resonator 210, as described above relative to FIG. 1C. The duration between time t3 and t4 in which transistor 222 is in its on state is controlled by controller 328 in controller circuitry 240 to effect ZVS of the turn on of transistor 220 as described above. This duration of gate signal G2 elapses at time t4 in FIG. 4, at which time G2 driver circuit 308 de-energizes (drives from high-to-low) gate signal G2. The operational cycle then repeats in cycle CYC2.

According to this example, therefore, controller circuitry 240 implements closed-loop control on the operation of piezoelectric-based power converter 200. In particular, the closed loop control of the duration of gate signal G1 and thus the turn-on time of transistor 220 regulates the energy transferred by power converter 200 to load 235. This closed loop control enables power converter 200 to operate efficiently and accurately over variations in the size and characteristics of piezoelectric resonator 210, as well as over different operating conditions (e.g., output current, output voltage) and variations in environmental conditions such as temperature. The complex calculations and lengthy trial-and error characterizations that are involved in open loop control piezoelectric-based converters can thus be avoided.

Figure 5:
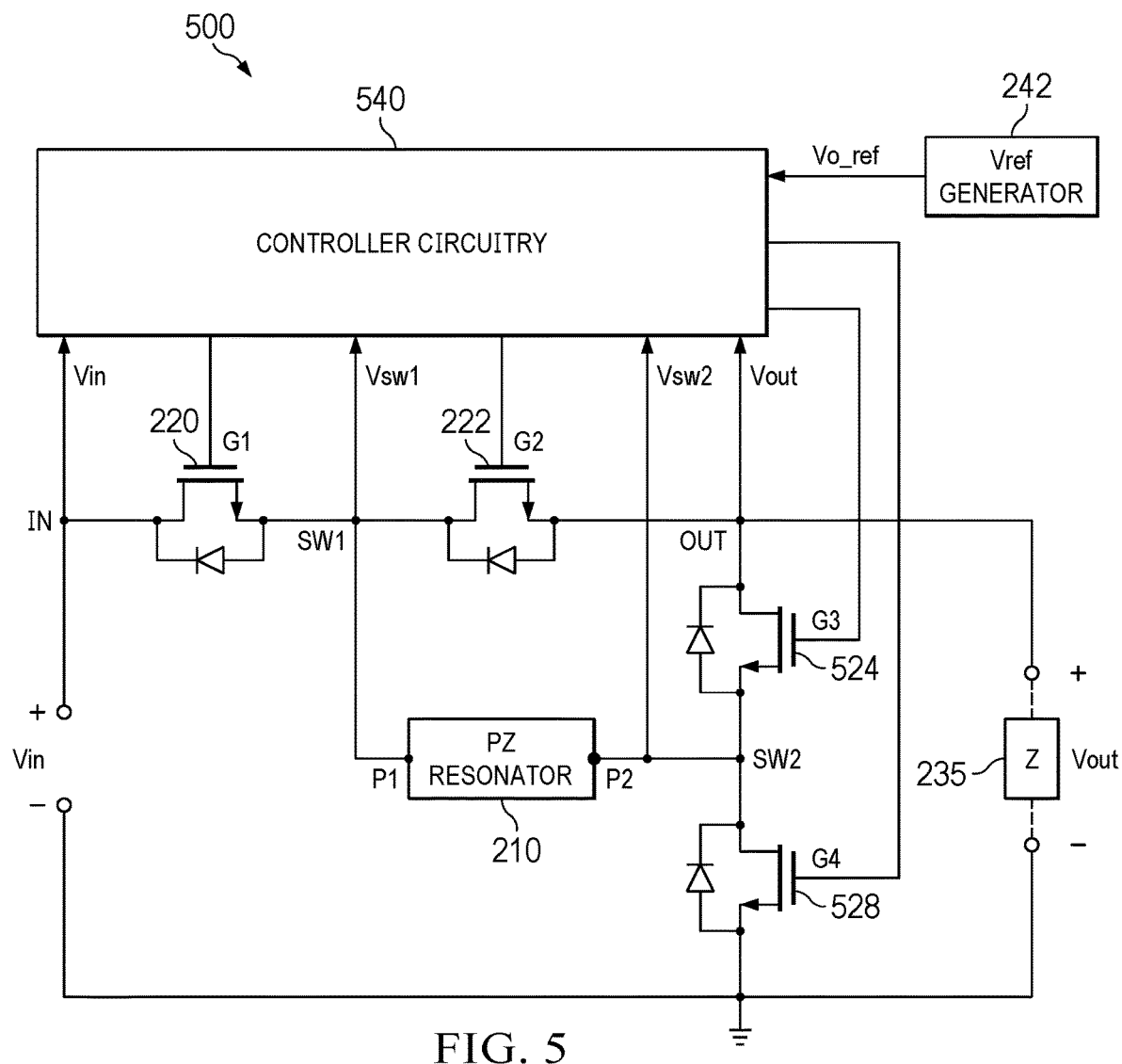
FIG. 5 is an electrical diagram, in block and schematic form, of a DC-DC converter according to another example.

Referring now to FIG. 5, power converter 500 according to an alternative example will be described. Power converter 500 is constructed similarly as power converter 200 described above relative to FIG. 2. Those components of power converter 500 that correspond to the same or similar (by function and/or structure) components in power converter 200 are shown in in FIG. 5 using the same reference numerals as in FIG. 2.

In power converter 500 according to this example, NMOS transistors 524, 528 replace diodes 224, 228, respectively. As shown in the example of FIG. 5, terminal SW2 at the second plate P2 of piezoelectric resonator 210 is coupled to the source of transistor 524 and the drain of transistor 528. The drain of transistor 524 is coupled to output terminal OUT, and the source of transistor 528 is coupled to circuit ground. The gate of transistor 524 is coupled to receive gate signal G3 from controller circuitry 540, and the gate of transistor 528 is coupled to receive gate signal G4 also from controller circuitry 540. Controller circuitry 540 also has an input coupled to terminal SW2 in this example, to receive voltage Vsw2 for use in deriving certain control timings as will be described below.

In the operation of power converter 200 of FIG. 2 described above, voltage Vsw2 at terminal SW2 of piezoelectric resonator 210 does not fully reach the level of output voltage Vout because of the diode voltage drop across diode 224 when forward-biased. Similarly, voltage Vsw2 in power converter 200 does not fully reach the ground level when diode 228 is forward biased, but instead remains a diode voltage drop above ground. Power converter 500 according to the alternative of FIG. 5 can attain additional efficiency, however, from its replacement of diodes 224, 228 in power converter 200 with MOS transistors 524, 528, respectively.

To accomplish this improvement in efficiency, controller circuitry 540 in this example is constructed to also control the timing and duration of gate signals G3, G4 within the operational cycles of power converter 500. In a general sense, controller circuitry 540 in this example is constructed and operates to turn on each of transistors 524, 528 at times in the operational cycle at which respective diodes 224, 228 would be forward-biased and conducting, and turn off transistors 524, 528 at those times in the operational cycle at which diodes 224, 228, respectively, would be reverse-biased and not conducting. Accordingly, transistors 524, 528 in power converter 500 of this example effectively play the role of diodes 224, 228 in power converter 200 but without the forward-biased diode voltage drop.

Controller circuitry 540 is constructed to include control circuitry for generating gate signals G1 and G2. For example, controller circuitry 540 may include the same circuitry for generating gate signals G1 and G2 described above relative to FIG. 3, operating as described above relative to FIG. 4.

Figure 6:
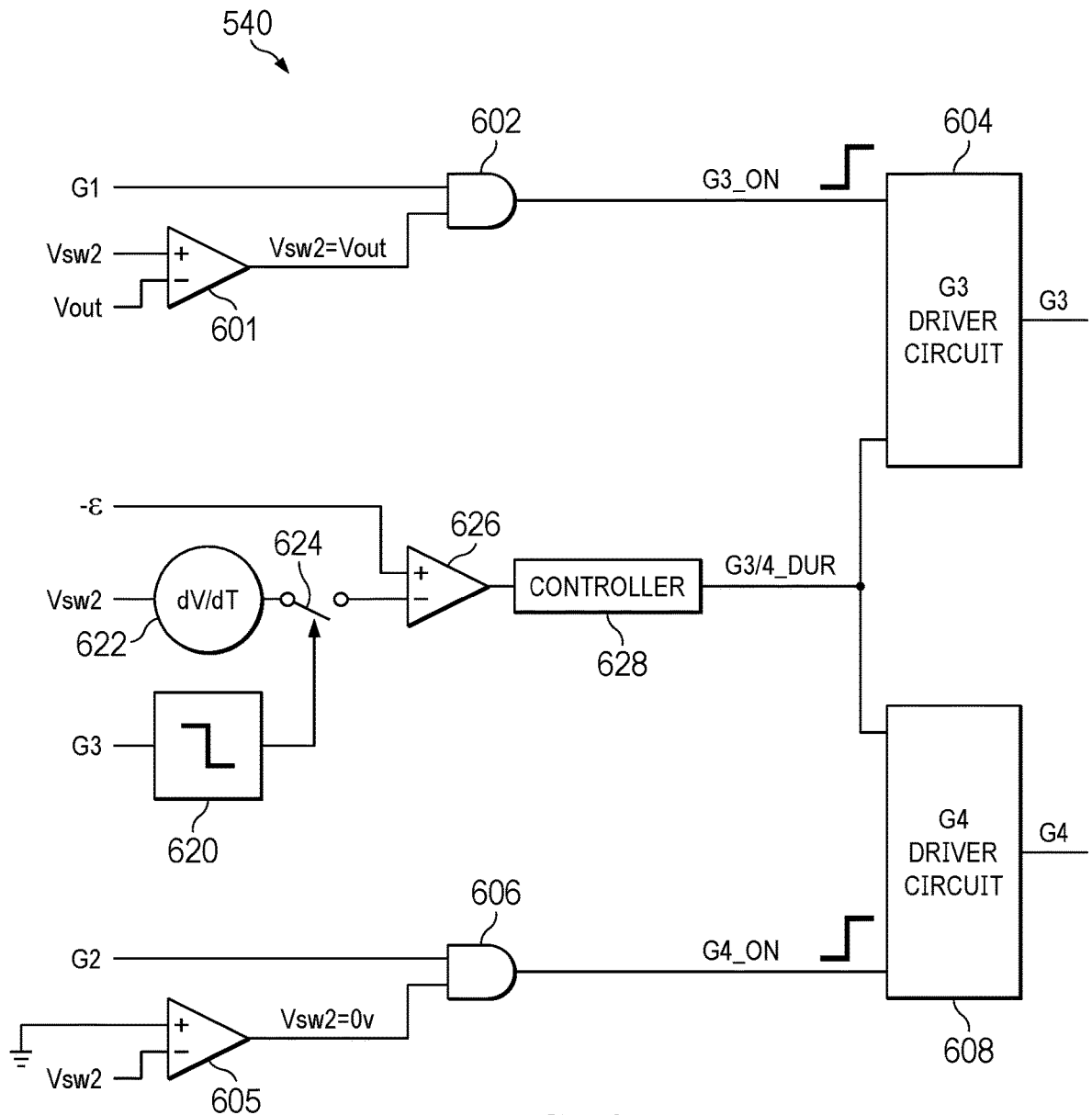
FIG. 6 is an electrical diagram, in block and schematic form, of a portion of controller circuitry in the DC-DC converter of FIG. 5 according to an example.

FIG. 6 schematically illustrates a portion of controller circuitry 540 that controls the generating of gate signals G3 and G4, which is provided in addition to circuitry for generating gate signals G1 and G2 (not shown in FIG. 6). Controller circuitry 540 includes AND gate 602, which has one input coupled to the output of gate driver 356 to receive gate signal G1, and a second input coupled to an output of a comparator 601. Comparator 601 has a positive input coupled to terminal SW2 and a negative input coupled to output terminal OUT and provides a signal in response to comparison of voltage Vsw2 with output voltage Vout. As such, the second input of AND gate 602 receives a logic signal indicating whether voltage Vsw2 at plate P2 of piezoelectric resonator 210 is at output voltage Vout (Vsw2=Vout). The output of AND gate 602 is coupled to an input to an input of G3 driver circuit 604 to provide signal G3_ON.

Controller circuitry 540 also includes AND gate 606. AND gate 606 has one input coupled to the output of gate driver 366 to receive gate signal G2 and has a second input coupled to an output of a comparator 605. Comparator 605 has a negative input coupled to terminal SW2 and a positive input coupled to ground and provides a signal in response to comparison of voltage Vsw2 with the ground voltage. As such, the second input of AND gate 606 receives a logic signal indicating whether voltage Vsw2 at plate P2 of piezoelectric resonator 210 is at the ground voltage. The output of AND gate 606 is coupled to an input of to an input of G4 driver circuit 608 to provide signal G4_ON.

As shown in FIG. 6, controller circuitry 540 further includes transition detector 620. Transition detector 620 has an input coupled to receive gate signal G3, and has an output coupled to a control terminal of switch 624.

Differentiator circuit 622 has an input coupled to terminal SW2 to receive voltage Vsw2, and has an output coupled to one side of switch 624. The other side of switch 624 is coupled to a negative input of comparator 626.

Comparator 626 has a positive input coupled to receive a voltage level representing a small negative value −ε (e.g., a voltage close to but below circuit ground). The output of comparator 626 is coupled to an input of controller 628. In this example, controller 628 is constructed as controller logic or circuitry configured to produce an analog or digital signal G3/4_DUR in response to a signal received at its input, according to an appropriate transfer function. In one example, controller 628 includes a proportional-integral (PI) controller. The output of controller 628, which presents signal G3/4_DUR, is coupled to an input of G3 driver circuit 604 and to an input of G4 driver circuit 608.

In this example, G3 driver circuit 604 and G4 driver circuit 608 are each constructed in a similar manner as G1 driver circuit 304 and G2 driver circuit 308 described above. More specifically, G3 driver circuit 604 may include logic and driver circuitry for driving gate signal G3 that is applied to the gate of transistor 524 in power controller 500. For example, G3 driver circuit 604 may include an edge-triggered latch having an input coupled to the output of AND gate 602 to receive signal G3_ON and an output coupled to a gate driver circuit having an output generating gate signal G3, and control logic having an input coupled to the output of controller 628 to receive signal G3/4_DUR and an output coupled to the latch of G3 driver circuit 604. G4 driver circuit 608 may be constructed similarly as G3 driver circuit 604, only with its edge-triggered latch coupled to the output of AND gate 606 to receive signal G4_ON, and its gate driver circuit generating gate signal G4.

In operation, the timing at which transistor 524 is turned on by is controlled by AND gate 602. In this example, AND gate 602 generates a low-to-high transition of signal G3_ON at its output in response to voltage Vsw2 at plate P2 of piezoelectric resonator 210 increasing to the level of output voltage Vout while gate signal G1 is turning on transistor 220. This low-to-high transition of signal G3_ON triggers G3 driver circuit 604 to drive gate signal G3 to a level that turns turn on transistor 524. For the example of FIG. 5, in which transistor 524 is a NMOS transistor, gate signal G3 is driven to at least a threshold voltage above voltage Vsw2 at the source of transistor 524. Because transistor 524 is turned on at a time in which its drain voltage at output terminal OUT and its source voltage Vsw2 are equal, the switching on of transistor 524 occurs at ZVS.

The timing at which transistor 528 is turned on is controlled by AND gate 606 in a similar fashion. In this example, AND gate 606 generates a low-to-high transition of signal G4_ON at its output in response to voltage Vsw2 at plate P2 of piezoelectric resonator 210 falling to ground while gate signal G2 is turning on transistor 222. This low-to-high transition of signal G4_ON triggers G4 driver circuit 608 to drive gate signal G4 to a level that turns turn on transistor 528. For the example of FIG. 5, in which transistor 528 is a NMOS transistor, gate signal G4 is driven to at least a threshold voltage above its source that is at ground. Because gate signal G4_ON is generated in response to gate drive signal G2 being turned on, the turn-on of transistor 528 lags the "on" state of transistor 222. Furthermore, the switching on of transistor 528 occurs at ZVS because transistor 528 is turned on at a time in which its drain voltage Vsw2 is equal to its source voltage at ground.

In this example, gate signals G3 and G4 have the same duration as one another, as the two stages of the operational cycle of DC-DC controller 500 are semi-symmetrical with one another. In this example, in response to gate signal G3 turning off transistor 524 in a previous cycle (indicated by a high-to-low transition of gate signal G3), transition detector 620 applies a high level control signal to switch 624, causing switch 624 to close. The closing of switch 624 samples the output of differentiator circuit 622, which presents an analog level corresponding to the time rate of change of voltage Vsw2 at that time.

In the operation of power converter 520, as will be described below, the voltage Vsw2 at terminal SW2 will be falling at the time that gate signal G3 transitions from high to low. The sampled output of differentiator circuit 622 is applied to the negative input of comparator 626. Comparator 626 compares the time rate of change of voltage Vsw2, sampled at the time at which gate signal G3 turns off, with negative threshold value −ε at its positive input to determine whether the voltage Vsw2 is falling at the time that transistor 524 is turned off. Comparator 626 issues a logic level at its output to controller 628 in response to this comparison of the time rate of change of voltage Vsw1 at the time it reaches input voltage Vin.

Controller 628 in this example is configured to generate an analog level on signal G3/4_DUR in response to the output of comparator 626. Analog signal G3/4_DUR indicates the duration of each of gate signals G3, G4 as generated by G3 driver circuit 604 and G4 driver circuit 608. In this example, controller 628 is constructed and operates to control the level of signal G3/4_DUR so that the voltage Vsw2 is at most only slightly falling at the time that gate signal G3 is turned off. For example, controller 628 may be constructed as a proportional-integral (PI) controller applying a transfer function that regulates the duration of gate signals G3 and G4 so that the time rate of change of voltage Vsw2 at the time gate signal G3 is turned off is close to zero (e.g., at a value less negative than the value −ε at the positive input of comparator 626). For the example of controller 628 realized as a PI controller, the transfer function applied by controller 628, expressed in the Laplace domain, may be in the form of:

$$\frac{K_P s + K_I}{s}$$

where s is the Laplace frequency, and where proportional coefficient $K_P$ and integral coefficient $K_I$ are selected through characterization or adaptation to provide the desired control of the duration of gate signals G3, G4 for the particular implementation of power converter 500, with a phase margin of at least 45° to ensure stability. Accordingly, controller circuitry 540 controls the durations of gate signals G3, G4 to attain ZCS as transistors 524, 528 are turned off. As such, controller circuitry 540 controls the duration of the turn-on times for transistors 524, 528 in a closed-loop fashion.

Figure 7:
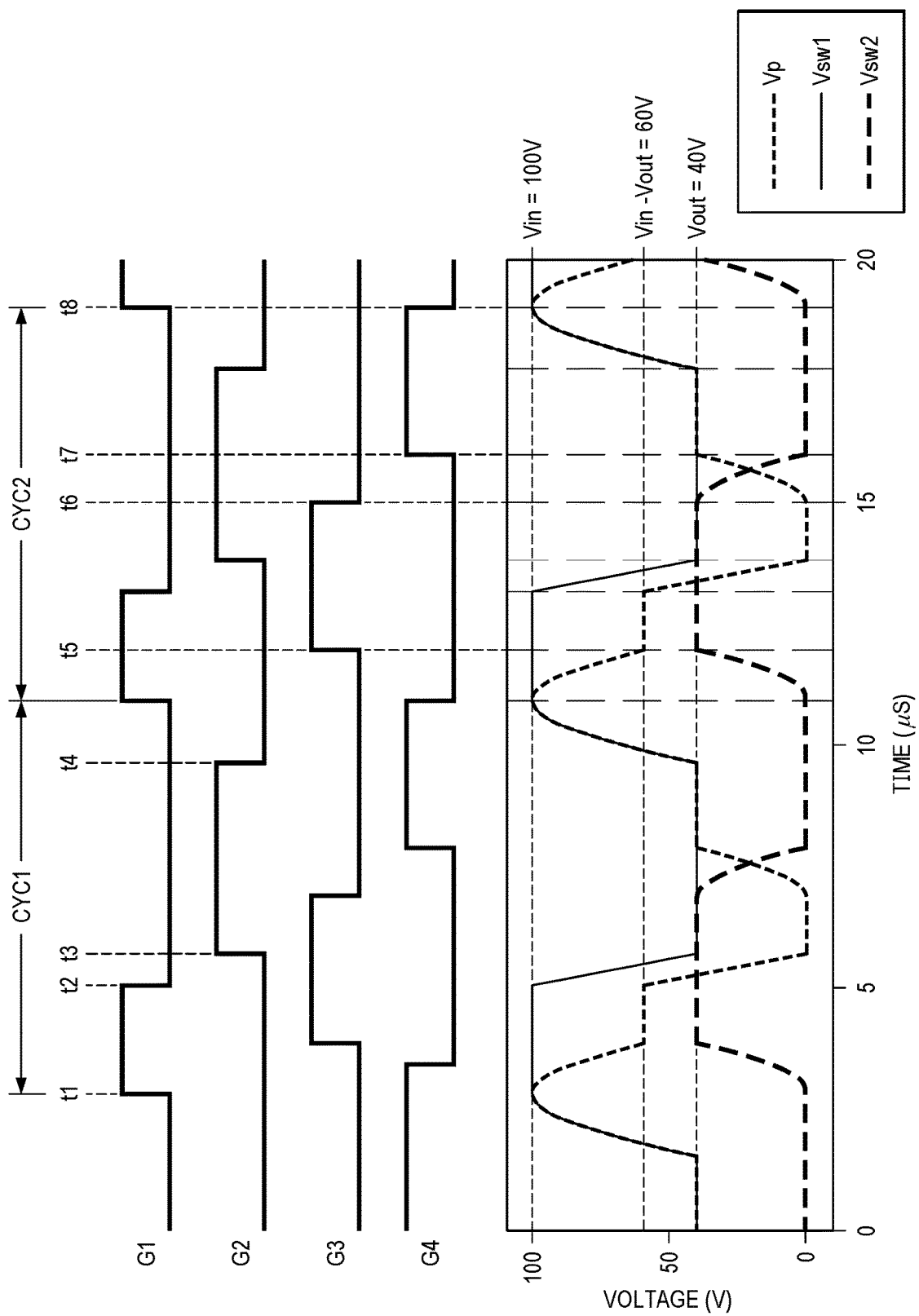
FIG. 7 is a timing diagram illustrating the operation of the DC-DC converter of FIG. 5 under control of the controller circuitry of FIG. 6 according to an example.

FIG. 7 illustrates an example of the timing of operational cycles CYC1, CYC2 of power converter 500 of FIG. 5. In this example, as before, input voltage Vin is 100 V, and output voltage Vout is regulated by power converter 500 to a level of 40 V. The transitions of gate signals G1 and G2 at times t1 through t4 are controlled by controller circuitry 540 in the manner described above in the example of FIG. 4. FIG. 7 further illustrates the transitions of gate signals G3, G4 as generated by G3 driver circuit 604 and G4 driver circuit 608, respectively, of controller circuitry 540. More specifically, the timing of gate signal G3 to turn on transistor 524 lags the timing of gate signal G1, and similarly the timing of gate signal G4 to turn on transistor 528 lags the timing of gate signal G2. In addition, controller circuitry 540 in this implementation controls the turn-on timing and duration for transistors 524, 528 to obey the constraint of zero voltage switching (ZVS).

Time t5 in FIG. 7 corresponds to a time in the operational cycle of power controller 500 at which gate signal G1 is turning on transistor 220, and at which voltage Vsw2 at plate P2 of piezoelectric resonator 510 has charged to reach the level of output voltage Vout. AND gate 602 of controller circuitry 540 in FIG. 6 indicates this condition by driving a low-to-high transition of signal G3_ON to G3 driver circuit 604, which in turn triggers G3 driver circuit 604 to drive gate signal G3 to a voltage that turns on transistor 524. Gate signal G3 is maintained at this level for a duration controlled by controller circuitry 540 as described above, namely according to the time rate of change of voltage Vsw2 at the turn-off of gate signal G3 in the previous cycle. Upon elapse of that duration at time t6, G3 driver circuit 604 drives gate signal G3 to a low level, turning off transistor 524.

Time t7 in FIG. 7 corresponds to a time at which AND gate 606 detects that voltage Vsw2 has discharged to ground while gate signal G2 is turning on transistor 222. In response, AND gate 606 drives a low-to-high transition of signal G4_ON, triggering G4 driver circuit 608 to drive gate signal G4 to a level that turns on transistor 528. Transistor 528 is held on by G4 driver circuit 608 for the duration controlled by controller circuitry 540, which is the same duration as that of gate signal G3. This duration elapses at time t8, at which time G4 driver circuit 608 drives gate signal G4 to a low level to turn off transistor 528.

According to this example, therefore, controller circuitry 540 applies closed-loop control on the operation of piezoelectric-based power converter 500 to regulate the transfer of energy from its input to its output, with efficiency and accuracy over variations in the size and characteristics of the particular piezoelectric resonator 210, and under different operating and environmental conditions. In addition, controller circuitry 540 in power converter 500 controls the turn-on times and durations for transistors 524, 528 to avoid diode voltage drops and thus improve efficiency, while attaining ZVS at turn on and ZCS at turn-off of those transistors 524, 528.

Power converter circuits 200, 500 are described above as operated over a series of two-stage cycles. For the example of power converter 200 of FIG. 2, each of these cycles includes a charging stage (e.g., transistor 220 is turned on to couple plate P1 of piezoelectric resonator 210 to input terminal IN) followed by a discharge stage (e.g., transistor 222 is turned on to couple plate P1 of piezoelectric resonator 210 to output terminal OUT). Referring back to FIG. 4, the voltage Vp across piezoelectric resonator 210 in each cycle follows a sequence of Vin, Vin−Vout, ground (0 V), and Vout, in which the charging stage (transistor 220 on) corresponds to voltage Vp at Vin and then Vin−Vout, and the discharge stage corresponds to voltage Vp at 0V and then Vout.

Figure 8:
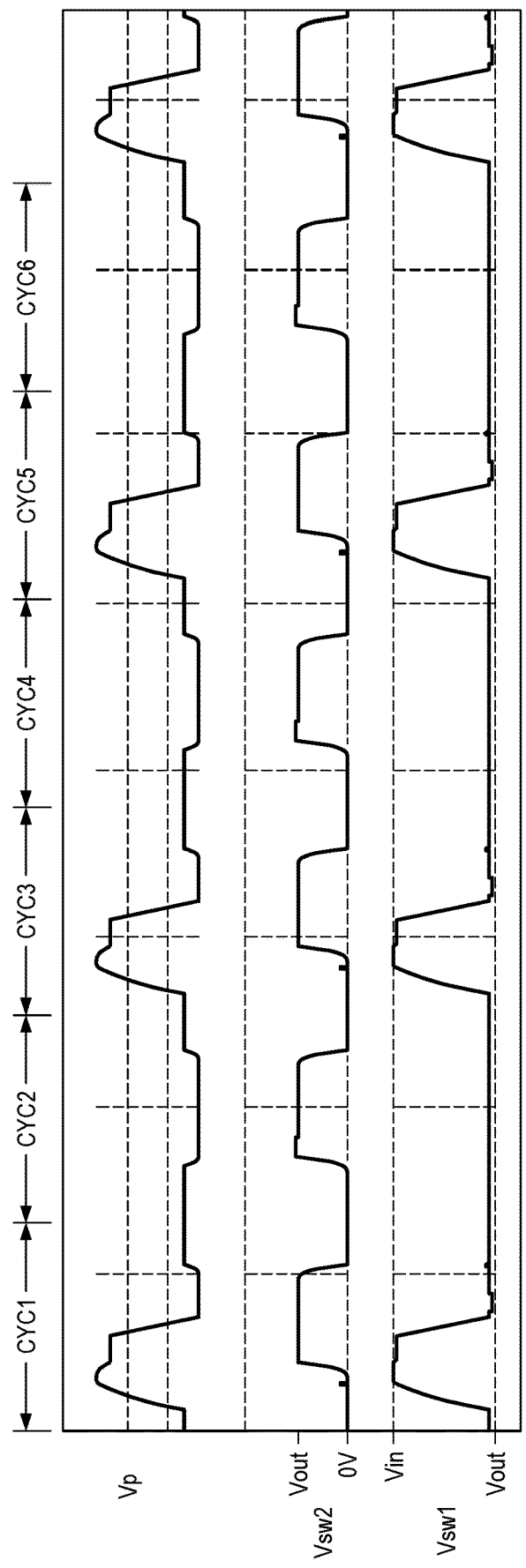
FIG. 8 is a timing diagram illustrating the operation of the power converter of FIG. 2 according to another example.

According to another alternative "hybride" mode implementation, controller circuitry 240 is constructed and operate such that transistor 220 is not turned on in every operational cycle of the power converter, whereas transistor 222 is turned on in every cycle. FIG. 8 illustrates voltages Vp, Vsw1, Vsw2 for the example of power converter 200 in FIG. 2 as it operates according to this hybrid mode alternative over six cycles CYC1 through CYC6. In this sequence of FIG. 8, controller circuitry 240 turns on transistor 220 in cycles CYC1, CYC3, and CYC5, but holds transistor 220 off in cycles CYC2, CYC4, and CYC6. Controller circuitry 240 turns on transistor 222 in every cycle (CYC1, CYC2, CYC3, CYC4, etc.) in this example of FIG. 8.

As such, in those cycles CYC1, CYC3, and CYC5 in which controller circuitry 240 turns on transistor 220, voltage Vsw1 at plate P1 of piezoelectric resonator 210 is charged to input voltage Vin, and voltage Vp across piezoelectric resonator 210 is at the Vin and Vin−Vout levels during the charging stage. In those cycles CYC2, CYC4, CYC6 in which controller circuitry 240 holds transistor 220 off, voltage Vsw1 remains at output voltage Vout, and voltage Vp remains at the Vout and ground levels. As evident from FIG. 8, voltage Vsw2 resonates in each cycle between voltage Vout and ground, according to the resonance of piezoelectric resonator 210.

In this alternative implementation, it is contemplated that controller circuitry 240 would include a counter or other logic that controls the holding off of transistor 220 in alternate cycles. For example, controller circuitry 240 may include a control register for storing a control value setting the intended mode of operation, whether a "normal" mode in which each of transistors 220, 222 are turned on in each cycle, or this hybrid mode in which transistor 220 is held off in alternate cycles.

According to yet another alternative implementation, controller circuitry 240 may be constructed to operate power converter 200 in a "burst" mode, in which a sequence of normal cycles including both charging and discharge stages are performed to fully charge piezoelectric resonator 210, followed by a burst of a number of cycles having only discharge stages. The number of cycles of discharge-only stages may be set in a control register in controller circuitry 240, or alternatively these discharge-only cycles may simply be allowed to continue until piezoelectric resonator 210 has released all or some fraction of its stored energy (e.g., until controller circuitry 240 detects that output voltage Vout falls below a threshold voltage). The operation may then be repeated with a sequence of normal cycles performed to charge piezoelectric resonator 210, followed by another burst of discharge-only cycles.

These alternative implementations of "hybrid" and "burst" mode operation may also be applied to the embodiment of DC-DC converter 500 described above relative to FIG. 5 through FIG. 7, via the appropriate construction of controller circuitry 540. Whether implemented in the embodiments described above or in alternative piezoelectric-based converter topologies, these alternative hybrid and burst modes of operation can reduce the overall power dissipation of the converter operation in certain applications.

Figure 10:
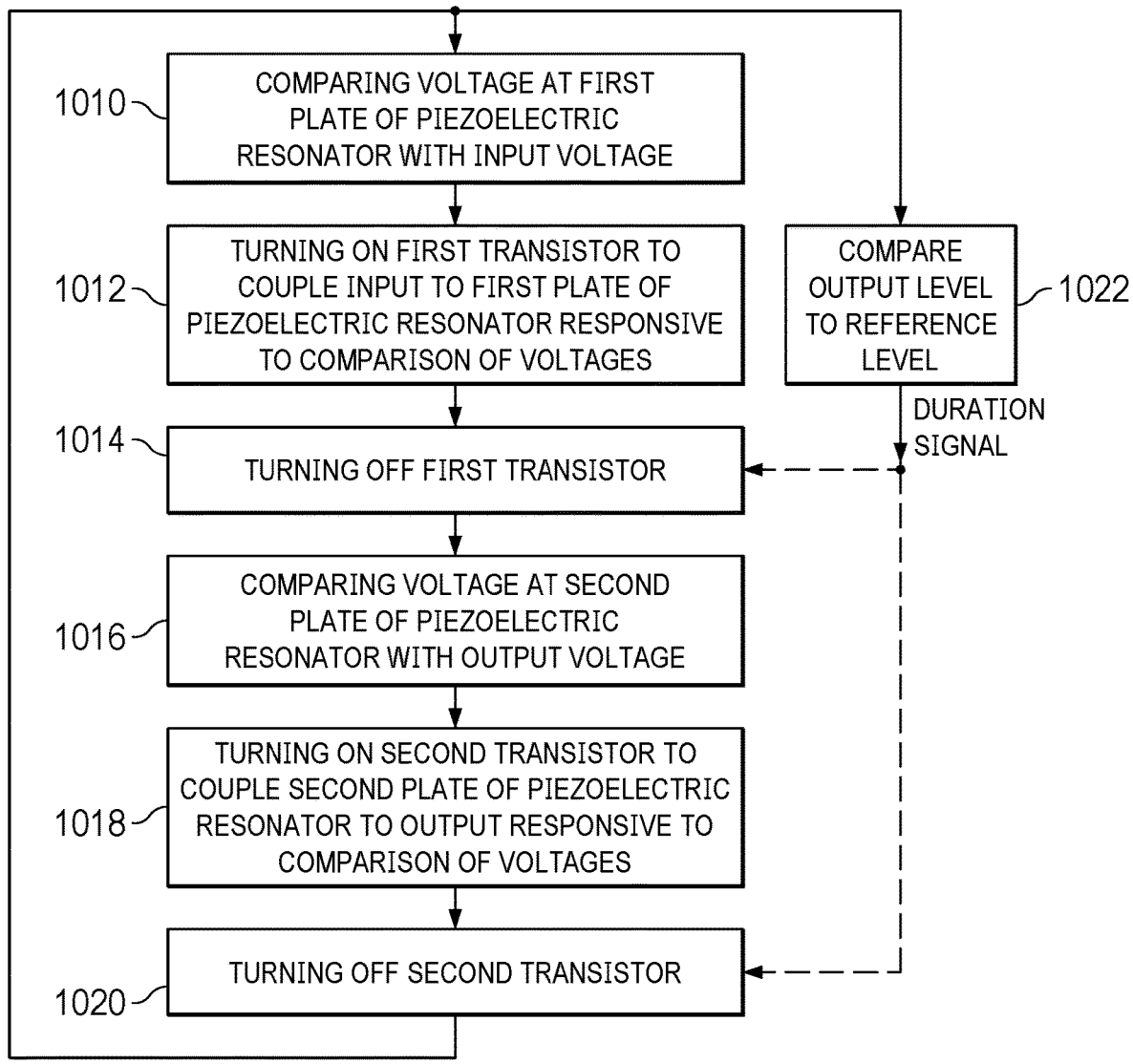
FIG. 10 is a flow diagram illustrating the operation of a power converter according to one or more examples.

FIG. 10 illustrates a flow diagram of the generalized operation of a power converter such as one of power converters 200, 500 in the implementations described above, under the control of controller circuitry 240, 540, respectively. For the example of power converter 200 of FIG. 2, a voltage Vsw1 at plate P1 of piezoelectric resonator 210 is compared with input voltage Vin at input terminal IN in block 1010. In response to this comparison, for example if the voltage Vsw1 at plate P1 of piezoelectric resonator 210 reaches input voltage Vin, transistor 220 is turned on in block 1012 to couple input terminal IN to terminal SW1 at plate P1. In block 1014, transistor 220 is turned off after some duration, for example as indicated by signal G1_DUR in controller circuitry 240.

In block 1016, voltage Vsw1 is compared with output voltage Vout at output terminal OUT. In response to this comparison, for example if the voltage Vsw1 has fallen to output voltage Vout, transistor 222 is turned on in block 1018 to couple terminal SW1 at plate P1 of piezoelectric resonator 210 to output terminal OUT. After some duration, for example as indicated by signal G2_DUR in controller circuitry 240, transistor 222 is turned off at block 1020. The functionality or operation indicated at blocks 1010, 1012, 1014, 1016, 1018, and 1020 may be repeated over a series of operational cycles.

In this implementation, controller circuitry 240 controls the turning off of one of transistors 220, 222 in blocks 1014, 1020, respectively, in response to a duration signal. As described above relative to FIG. 9A and FIG. 9B, the duration of the on state of one of transistors 220, 222 may be used to control the output level (output voltage Vout or output current Iout), given the duration of the on state of the other transistor. In the examples described above, the duration of the on state of transistor 220 is used to control the output voltage Vout. Referring back to FIG. 10, controller circuitry 240 compares an output level relative to a reference level in block 1022, generating a duration signal in response to that comparison. In the examples described above, signal G1_DUR is generated in response to a comparison of output voltage Vout with a reference level corresponding to reference voltage Vo_ref, and controls the turning off of transistor 220 in block 1014.

Further operations involved in the method of FIG. 10 may be included in addition to those in the flow diagram, as described above. Variations on this method of operation as described above and as will be apparent to the reader are also contemplated.

The term "couple", as used herein, may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component. Also, an "input terminal" and an "output terminal" may be respectively referred to herein as an "input" and "output."

Unless otherwise stated, "about," "approximately," or "substantially" preceding a value means+/−10 percent of the stated value. Modifications are possible in the described examples, and other examples are possible within the scope of the claims.

It is contemplated that modifications of, and alternatives to, the embodiments described in this specification, such modifications and alternatives capable of obtaining one or more the advantages and benefits enabled by described examples, will be apparent to those of ordinary skill in the art having reference to this specification and its drawings. It is contemplated that such modifications and alternatives are within the scope of the claims presented herein.

What is claimed is:

1. An apparatus, comprising:
   a first transistor coupled between a power input and a resonator terminal, the first transistor having a first control terminal;
   a second transistor coupled between the resonator terminal and a power output, the second transistor having a second control terminal; and
   controller circuitry having first, second, and third control inputs and first and second control outputs, the first control input coupled to the power input, the second control input coupled to the resonator terminal, the third control input coupled to the power output, the first control output coupled to the first control terminal, and the second control output coupled to the second control terminal.

2. The apparatus of claim 1, wherein the controller circuitry is configured to:
   generate a first control signal at the first control output responsive to a comparison between a first voltage at the power input and a second voltage at the resonator terminal; and
   generate a second control signal at the second control output responsive to a comparison between a third voltage at the power output and the second voltage at the resonator terminal.

3. The apparatus of claim 2, wherein the controller circuitry is configured to:
   responsive to the second voltage exceeding the first voltage, generate a state transition of the first control signal; and
   responsive to the third, voltage exceeding the second voltage, generate a state transition of the second control signal.

4. The apparatus of claim 3, wherein the controller circuitry is configured to:
   set a first duration of the first control signal having a first state responsive to the first voltage; and
   set a second duration of the second control signal having a second state responsive to an edge rate of the second voltage.

5. The apparatus of claim 4,
wherein the first transistor is configured to be enabled responsive to the first control signal having a first state, and the second transistor is configured to be enabled responsive to the second control signal having a second state.

6. The apparatus of claim 4, is configured to:
sample the edge rate of the second voltage responsive to the second voltage exceeding the first voltage; and
set the second duration responsive to the sampled edge rate of the second voltage.

7. The apparatus of claim 2, wherein the resonator terminal is a first resonator terminal, and the apparatus further comprises:
a third transistor coupled between the power output and a second resonator terminal, the third transistor having a third control terminal; and
a fourth transistor coupled between the second resonator terminal and a ground terminal, the fourth transistor having a fourth control terminal; and
wherein the controller circuitry has a fourth control input and third and fourth control outputs, the fourth control input coupled to the second resonator terminal, the third control output coupled to the third control terminal, and the fourth control output coupled to the fourth control terminal.

8. The apparatus of claim 7, wherein the controller circuitry is configured to:
generate a third control signal at the third control output responsive to the first control signal and a comparison between the third voltage at the power output and a fourth voltage at the second resonator terminal; and
generate a fourth control signal at the fourth control output responsive to the second control signal and the fourth voltage.

9. The apparatus of claim 8, wherein the control circuitry is configured to set a respective duration of the third and fourth control signals having a particular state responsive to an edge rate of the fourth voltage.

10. The apparatus of claim 9, wherein the control circuitry is configured to sample the edge rate of the fourth voltage responsive to a transition of the third control signal, and set the respective duration responsive to the sampled edge rate of the fourth voltage.

11. The apparatus of claim 1, wherein the resonator terminal is a first resonator terminal, and the apparatus further comprises:
a first diode coupled between the power output and a second resonator terminal; and
a second diode coupled between the second resonator terminal and a ground terminal.

12. The apparatus of claim 1, further comprising a piezoelectric resonator coupled to the resonator terminal.

13. A method comprising:
receiving a first voltage at a power input;
receiving a second voltage at a resonator terminal;
receiving a third voltage at a power output;
responsive to a comparison between the second voltage and the first voltage, turning on a first transistor coupled between the power input and the resonator terminal; and
responsive to a comparison between the third voltage and the second voltage, turning on a second transistor coupled between the resonator terminal and the power output.

14. The method of claim 13, further comprising:
setting a turn-on duration of the first transistor responsive to the first voltage; and
setting a turn-on duration of the second transistor responsive to an edge rate of the second voltage.

15. The method of claim 14, further comprising:
sampling the edge rate responsive to the second voltage exceeding the first voltage; and
setting the turn-on duration of the second transistor responsive to the sampled rate edge.

16. The method of claim 14, further comprising turning off both the first and second transistors prior to turning on the first transistor.

17. The method of claim 14, further comprising turning off both the first and second transistors prior to turning on the second transistor.

18. The method of claim 13, wherein the resonator terminal is a first resonator terminal, and the method further comprises:
receiving a fourth voltage at a second resonator terminal;
responsive to a state of the first transistor and a comparison between the third voltage at the power output and the fourth voltage, turning on a third transistor coupled between the second resonator terminal and the power output; and
responsive to a state of the second transistor and the fourth voltage, turning on a fourth transistor coupled between the second resonator terminal and a ground terminal.

19. The method of claim 18, further comprising:
setting a turn-on duration of the third and fourth transistors responsive to an edge rate of the fourth voltage.

* * * * *